US010957961B2

(12) United States Patent
Kim et al.

(10) Patent No.: US 10,957,961 B2
(45) Date of Patent: Mar. 23, 2021

(54) CAVITY FILTER

(71) Applicant: KMW INC., Hwaseong-si (KR)

(72) Inventors: Duk Yong Kim, Hwaseong-si (KR); Sung Ho Jang, Hwaseong-si (KR); Joung-hoe Kim, Hwaseong-si (KR); Dae Eil Jo, Suwon-si (KR); Nam Shin Park, Hwaseong-si (KR)

(73) Assignee: KMW INC., Hwaseong-si (KR)

( * ) Notice: Subject to any disclaimer, the term of this patent is extended or adjusted under 35 U.S.C. 154(b) by 0 days.

(21) Appl. No.: 16/524,062

(22) Filed: Jul. 28, 2019

(65) Prior Publication Data

US 2019/0348734 A1    Nov. 14, 2019

Related U.S. Application Data

(63) Continuation of application No. PCT/KR2018/001180, filed on Jan. 26, 2018.

(30) Foreign Application Priority Data

Jan. 31, 2017 (KR) .................. 10-2017-0013798
Jun. 13, 2017 (KR) .................. 10-2017-0074330

(51) Int. Cl.
| | |
|---|---|
| *H01P 1/208* | (2006.01) |
| *H01Q 1/24* | (2006.01) |
| *H01R 12/58* | (2011.01) |
| *H01R 12/71* | (2011.01) |
| *H01R 13/17* | (2006.01) |
| *H01R 13/187* | (2006.01) |

(Continued)

(52) U.S. Cl.
CPC ........... *H01P 1/2088* (2013.01); *H01Q 1/241* (2013.01); *H01R 12/585* (2013.01); *H01R 12/712* (2013.01); *H01R 13/17* (2013.01); *H01R 13/187* (2013.01); *H01R 13/6473* (2013.01); *H04B 7/0413* (2013.01)

(58) Field of Classification Search
CPC .... H01R 12/585; H01R 12/712; H01R 13/07; H01R 13/187; H01R 13/6473
USPC .............................. 439/55; 174/261; 385/81
See application file for complete search history.

(56) References Cited

U.S. PATENT DOCUMENTS

| | | |
|---|---|---|
| 4,993,657 A | 2/1991 | Shino |
| 5,035,628 A | 6/1991 | Casciotti et al. |

(Continued)

FOREIGN PATENT DOCUMENTS

| | | |
|---|---|---|
| CN | 204243344 U | 4/2015 |
| JP | S50-25987 U | 8/1975 |

(Continued)

OTHER PUBLICATIONS

Office action dated Jul. 31, 2019 for Chinese Application No. 201810091290.3.

(Continued)

*Primary Examiner* — Peter G Leigh

(57) ABSTRACT

The present invention provides a cavity filter having a slim and compact structure in which a push-pin type RF connector, which is formed such that a terminal is exposed to both sides or one side in a height direction, is embedded so as to reduce a size of an antenna system, quickly perform verification for an individual cavity filter while having high reproducibility, and enable the antenna system to be readily mounted.

20 Claims, 26 Drawing Sheets

(51) Int. Cl.
*H01R 13/6473* (2011.01)
*H04B 7/0413* (2017.01)

(56) References Cited

U.S. PATENT DOCUMENTS

| | | | | |
|---|---|---|---|---|
| 7,205,868 B2* | 4/2007 | Park | ................ | H01P 1/205 |
| | | | | 333/203 |
| 8,179,212 B2* | 5/2012 | Seo | ................ | H01P 7/04 |
| | | | | 333/203 |
| 8,686,810 B2* | 4/2014 | Park | ................ | H01P 1/2053 |
| | | | | 333/203 |
| 8,704,617 B2* | 4/2014 | Chun | ................ | H01P 1/2053 |
| | | | | 333/203 |
| 9,035,727 B2* | 5/2015 | Han | ................ | H01P 1/2084 |
| | | | | 333/203 |
| 9,379,471 B2* | 6/2016 | Lee | ................ | H01R 13/405 |
| 9,397,377 B2* | 7/2016 | Seo | ................ | H01P 1/2084 |
| 9,627,732 B2* | 4/2017 | Lee | ................ | H01P 5/026 |
| 2006/0001510 A1 | 1/2006 | Engelhardt et al. | | |
| 2011/0133862 A1* | 6/2011 | Chun | ................ | H01P 11/007 |
| | | | | 333/209 |
| 2012/0051016 A1 | 3/2012 | Rathburn | | |
| 2012/0164888 A1 | 6/2012 | Rathburn | | |
| 2013/0330944 A1 | 12/2013 | Rucki et al. | | |
| 2015/0061794 A1 | 3/2015 | Tong | | |
| 2015/0280302 A1* | 10/2015 | Seo | ................ | H01P 1/2084 |
| | | | | 333/209 |
| 2017/0310005 A1* | 10/2017 | Kang | ................ | H03F 3/45475 |

FOREIGN PATENT DOCUMENTS

| | | | |
|---|---|---|---|
| KR | 10-2011-0041919 A | | 4/2011 |
| KR | 20110041919 A | * | 4/2011 |
| KR | 10-2016-0044861 A | | 4/2016 |
| KR | 20-0481791 Y1 | | 11/2016 |
| WO | 2015-131600 A1 | | 9/2015 |

OTHER PUBLICATIONS

International Search Report for PCT/KR2018/001180 dated May 1, 2018 and its English translation.
Japanese Office Action dated Sep. 29, 2020 for Japanese Application No. 2019-541175.
An Extended European Search Report dated Jul. 29, 2020 for European Application No. 18748485.2.

* cited by examiner (a)

(b)

(c)

CAVITY FILTER

CROSS-REFERENCE TO RELATED APPLICATIONS

This application is a continuation application of International Application No. PCT/KR2018/001180, filed on Jan. 26, 2018, which claims priority and benefits of Korean Application Nos. 10-2017-0013798, filed on Jan. 31, 2017; and 10-2017-0074330, filed on Jun. 13, 2017, the content of which is incorporated herein by reference in their entirety.

TECHNICAL FIELD

The present disclosure relates to a cavity filter. More particularly, the present disclosure relates to a cavity filter for massive MIMO antennas, which has an improved connector fastening structure between a filter and a printed circuit board in consideration of ease of assembly and size.

BACKGROUND ART

The statements in this section merely provide background information related to the present disclosure and may not constitute prior art.

Multiple Input Multiple Output (MIMO) technology dramatically increases data transmission capacity by using multiple antennas. This technology is a spatial multiplexing technique by which a transmitter transmits different data through different transmission antennas, and a receiver distinguishes the transmitted data through proper signal processing. Therefore, as the number of transmission antennas and the number of reception antennas are simultaneously increased, channel capacity may increase, thereby enabling more data to be transmitted. For example, when the number of antennas is increased to 10, a channel capacity of about 10 times that of the current single-antenna system is secured in the same frequency band.

The 4G LTE-advanced system employs up to 8 antennas, and a product equipped with 64 or 128 antennas is being developed in the pre-5G stage. Base station equipment with a much larger number of antennas is expected to be employed in the 5G system, and the technology therefor is called massive MIMO. Massive MIMO is also referred to as full dimension (FD)-MIMO because massive MIMO enables 3D-beamforming while current cell operation is 2-dimensional.

In massive MIMO, as the number of antenna elements increases, the number of transceivers and filters increases. In 2014, more than 200,000 base stations are deployed nationwide. In other words, there is a need for a structure of a cavity filter that minimizes a mounting space and can be mounted easily, and there is also a need for an RF signal line connection structure that provides the same filter characteristics even after individually tuned cavity filters are mounted on the antennas.

In an RF filter having a cavity structure, a resonator including a resonance rod, which is a conductor, is provided inside a box structure formed of a metallic conductor to allow only an electromagnetic field of a natural frequency to be present. Thereby, the RF filter allows only a characteristic frequency component of a very high frequency to pass therethrough by resonance. A bandpass filter with such a cavity structure is widely used as a filter for antennas of a mobile communication base station as it has a low insertion loss and is advantageous for high output power.

DISCLOSURE

Technical Problem

It is an object of the present disclosure to provide a cavity filter having a slim and compact structure and an RF connector embedded in a body in a thickness direction thereof.

It is another object of the present disclosure to provide an assembly method capable of minimizing the cumulative amount of assembly tolerances generated at the time of installing a plurality of filters and an RF signal connection structure that is easily mounted and capable of maintaining uniform frequency characteristics of the filters.

Technical Solution

In accordance with one aspect of the present disclosure, provided is a cavity filter used in a base station antenna for mobile communication and installed on an external member, including a resonant element; a first case disposed on the external member and containing the resonance element therein; and a terminal unit arranged passing through the first case to electrically connect an electrode pad of the external member and the resonance element, the terminal unit being electrically insulated from the first case; wherein the terminal unit includes a terminal insertion hole formed in a lower end surface of the first case by recessing at least a part of the first case; a pin member including a pin portion disposed in the terminal insertion hole and having one end connected to the resonance element, and a terminal body portion extending from an opposite end of the pin portion and having a diameter larger than a diameter of the pin portion; and an elastic connector formed of a conductive material having elasticity and disposed between the terminal body portion and the electrode pad to electrically connect the terminal body portion and the electrode pad, the elastic connector being configured to be compressed to provide a contact pressure to the pin member and the electrode pad when the cavity filter is installed on the outer member.

The cavity filter may further include a dielectric bush inserted into the terminal insertion hole, wherein the terminal insertion hole may include a third insertion hole having a constant air gap with respect to the terminal body portion in a radial direction; a second insertion hole having a diameter smaller than a diameter of the third insertion hole, a part of the dielectric bush being inserted into the second insertion hole; and a first insertion hole having a diameter smaller than the diameter of the second insertion hole, and a part of the dielectric bush inserted into the first insertion hole.

The dielectric bush may be formed in a two-stage cylindrical shape having a first stage and a second stage having a larger diameter than the first stage, and be provided with a through hole passing through a central axis of rotation, wherein the pin portion may be inserted into the through hole from a side to the second stage to fix the pin member to the dielectric bush.

The pin portion may include a wedge-shaped protrusion formed on an outer circumferential surface thereof to prevent the pin portion from being separated in a direction opposite to a direction of insertion into the dielectric bush.

The terminal body portion may be formed to be shorter than a depth of the third insertion hole and include a cylindrical hollow portion; and a conical opening having a diameter decreasing inward from an inlet thereof.

The hollow portion may include a first annular groove formed in an inner circumferential surface of the hollow portion.

The elastic connector may include a cylindrical member inserted into the hollow portion; a wedge-shaped annular protrusion protruding from an outer circumferential surface of the cylindrical member; a truncated cone-shaped pin socket contact portion extending from the cylindrical member and inserted into the opening; an impedance matching portion extending from the pin socket contact portion; and at least one cutout portion formed along a central axis of the elastic connector from an outer side surface of the elastic connector exposed to an outside after being inserted into the hollow portion, wherein the cutout may extend to a depth passing the annular protrusion, wherein the annular protrusion may be formed to have a size preventing the elastic connector from being separated by being accommodated in the annular groove when the elastic connector is inserted into the hollow portion.

An angle of the pin socket contact portion with respect to the central axis may be larger by 5 to 10 degrees than an angle of the opening with respect to the center axis.

An electrode edge formed by an outer side surface of the elastic connector and an outer circumferential surface of the impedance matching portion may have a round shape in a range of R0.1 to R0.5.

The cavity filter may further include a compression spring-type pin spring inserted into a space between an inner side surface of the hollow portion and the elastic connector.

The elastic connector may include a circular spring portion formed of an elongated spring plate having a constant width over most of a length thereof except for both ends thereof and having a circular central portion; and two plate-shaped protrusions protruding from two adjacent points on a circumference of the circular spring portion so as to be perpendicular to the circumference, wherein the width of the spring plate member may be less than a diameter of the hollow portion, wherein a diameter of the circular spring portion may be larger than a diameter of the terminal body portion.

The opening may be formed at an angle allowing the circular spring portion to circumscribe about the opening.

A gap between the hollow portion and the plate-shaped protrusion inserted into the hollow portion may be filled with solder to electrically and mechanically connect the elastic connector and the pin member.

The terminal insertion hole of the elastic connector of the cavity filter may include a fourth insertion hole formed from the lower end surface of the first case and having a diameter equal to a diameter of a large-diameter part of a two-stage cylindrical shape of the dielectric bush, the fourth insertion hole extending a long distance so as to be parallel to the lower end surface; and a fifth insertion hole formed at a central position of one side of the fourth insertion hole, a first stage of the dielectric bush being inserted into the fifth insertion hole.

The elastic connector may be formed in the shape of a leaf spring and include a pin insertion hole allowing the elastic connector to be inserted thereinto and supported by the terminal body portion; a first extension extending in a direction perpendicular to a center axis of the pin portion; and a second extension portion bent from the first extension portion at an obtuse angle and extended to protrude out of the lower end surface of the first case.

The terminal body portion may be formed such that an outer side surface of the terminal body portion has a predetermined air gap from the lower end surface of the first case when the elastic connector is inserted into the pin portion through the pin insertion hole and the pin member is connected to the dielectric bush.

The cavity filter may further include a star washer electrically connected to the first case, wherein the first case may further include a second annular groove surrounding the third insertion hole, wherein the second annular groove may be formed to accommodate the star washer such that at least a part of the star washer protrudes out of the lower end surface of the first case.

The second annular groove may be formed in a circular dovetail shame such that a diameter of a circumferential surface thereof corresponding to an outer diameter increases in a depth direction, wherein an inlet outer diameter of the second annular groove may be a minimum diameter allowing the star washer to be contracted and inserted into the second annular groove by elasticity and preventing the star washer from being separated.

The second annular groove may include a plurality of press-fit pin holes formed around the second annular groove; and a press-fit pin inserted into the press-fit pin holes having a head portion positioned lower than the lower end surface of the first case when the press-fit pin is into the press-fit pin holes, the head portion at least partially protruding to the second annular groove to prevent the star washers from being separated.

The second annular groove may include a calking hole formed around the second annular groove so as to be close to the second annular groove, wherein, after the star washer is inserted, a sidewall of the circumferential surface corresponding to the outer diameter of the second annular groove may be recessed toward a central axis of the second annular groove by caulking to prevent the star washer from being separated.

Advantageous Effects

The present disclosure provides a cavity filter with a slim and compact design wherein an RF connector including an elastic connector is embedded in a body thereof in a thickness direction. Thereby, the size of the antenna system may be reduced, and individual cavity filters may be quickly verified with high reproducibility. Further, multiple cavity filters may be easily installed inside the antenna of a mobile communication base station.

BEST MODE

Figure 1:
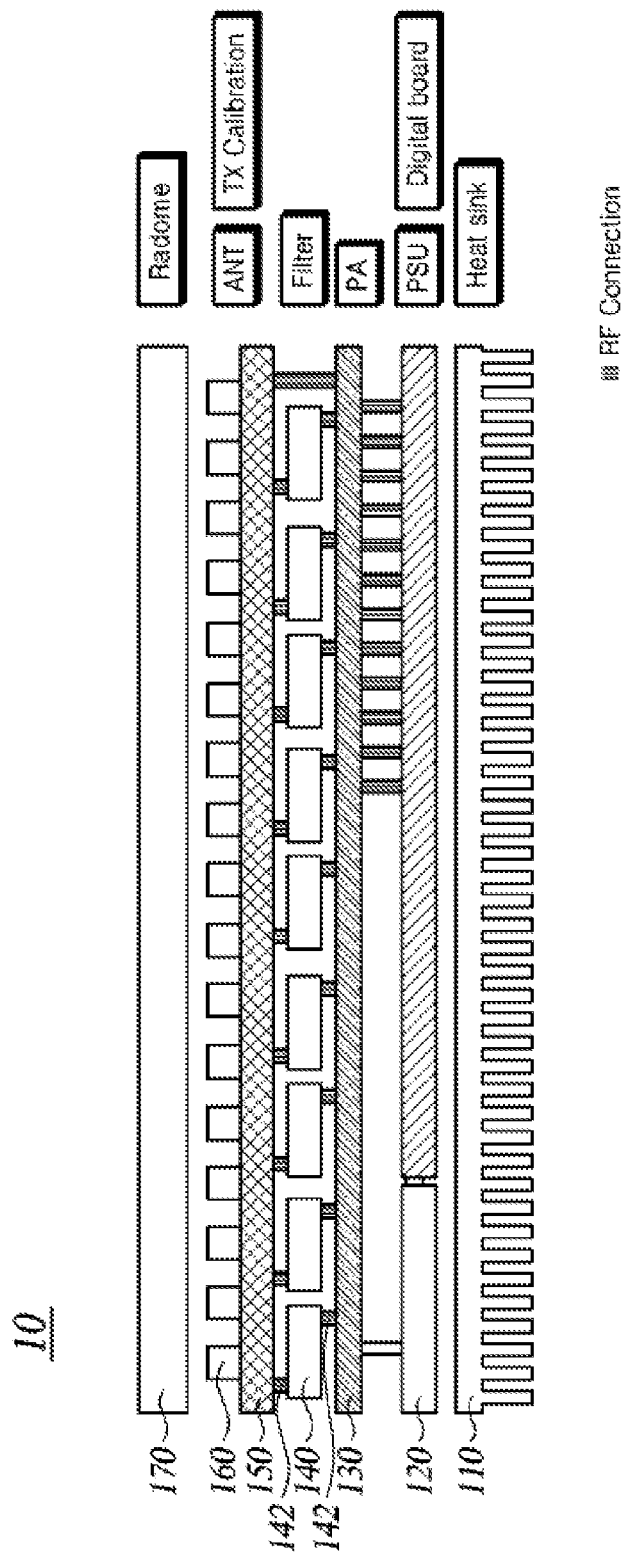
FIG. 1 is a diagram illustrating a stack structure of an exemplary massive MIMO antenna.

Hereinafter, some embodiments of the present disclosure will be described in detail with reference to the accompanying drawings. It should be noted that, in adding reference numerals to the constituent elements in the respective drawings, like reference numerals designate like elements, although the elements are shown in different drawings. Further, in the following description of the present disclosure, a detailed description of known functions and configurations incorporated herein will be omitted when it may make the subject matter of the present invention rather unclear.

Additionally, various terms such as first, second, A, B, (a), (b), etc., are used solely for the purpose of differentiating one component from the other but neither imply nor suggest the substances, order or sequence of the components. Throughout this specification, when a part "includes" or "comprises" a component, the part may further include other components, and such other components are not excluded unless there is a particular description contrary thereto. Terms such as "unit," "module," and the like refer to units for processing at least one function or operation, which may be implemented by hardware, software, or a combination thereof.

FIG. 1 is a diagram illustrating a stack structure of an exemplary massive MIMO antenna.

FIG. 1 is a perspective view showing an exemplary external shape of an antenna device 10 in which an antenna assembly according to the present disclosure is provided. The antenna device 10 includes a housing provided with a heat sink 110, and a radome 170 coupled to the housing. The antenna assembly is arranged between the housing and the radome 170. A power supply unit (PSU) 120 is coupled to a lower portion of the housing through, for example a docking structure. The PSU 120 provides operating power for operating electronic components provided in the antenna assembly.

Typically, the antenna assembly includes an antenna board 150 having a plurality of antennas 160 arranged on the front surface thereof. On the rear surface of the antenna board, cavity filters 18 equal in number to the number of the antennas 160 are disposed, and subsequently a related PCB board 130 is stacked. Before being mounted, the cavity filters 140 are individually tuned and verified so as to have a frequency characteristic that meets the specification. The tuning and verification process may be quickly performed in an environment having the same characteristics as the mounted state.

Figure 2:
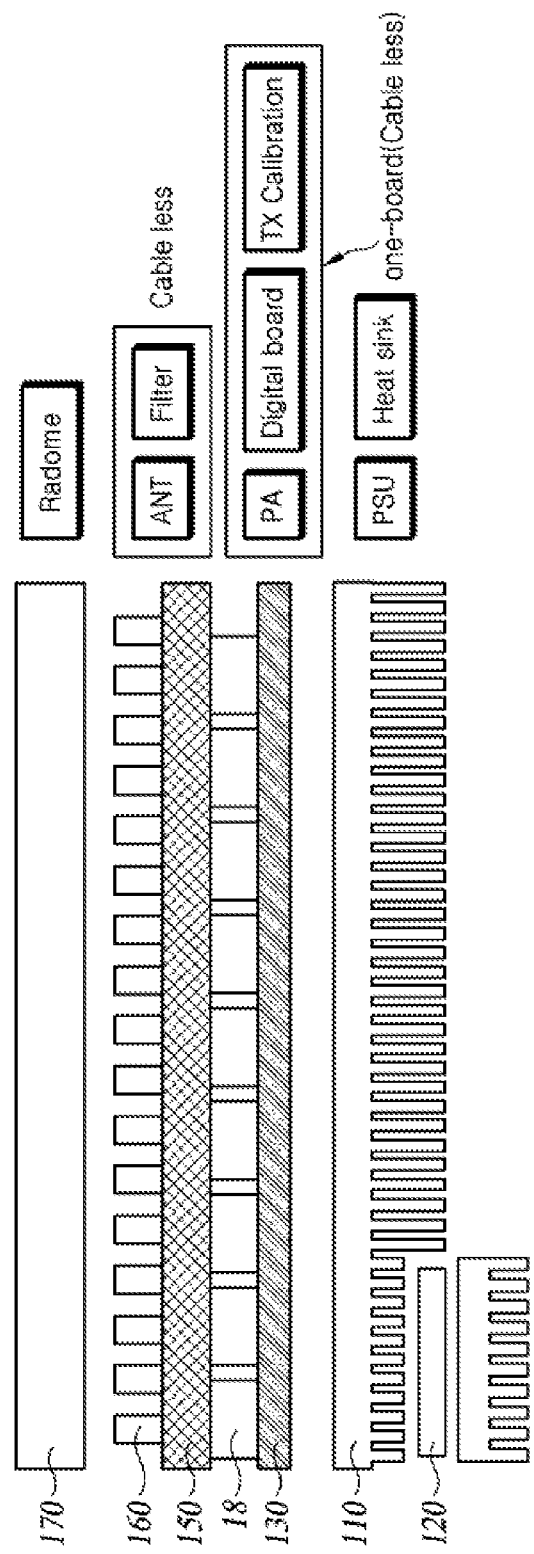
FIG. 2 is a cross-sectional view illustrating a cavity filter according to an embodiment of the present disclosure, which is stacked between an antenna board and a control board.

FIG. 2 is a cross-sectional view illustrating a cavity filter according to an embodiment of the present disclosure, which is stacked between an antenna board and a control board.

Referring to FIG. 2, as the conventional RF connector 142 is eliminated, connection may be facilitated and an antenna structure 11 with a lower height profile may be provided. In addition, RF connectors are provided on both surfaces facing in the vertical direction and are connected with elastic connectors 240, 340 and 440. Thereby, even if vibration or thermal deformation occurs in the antenna board 150 or the PCB 130, the RF connection may remain the same without change in frequency characteristics.

Embodiment 1

Figure 3:
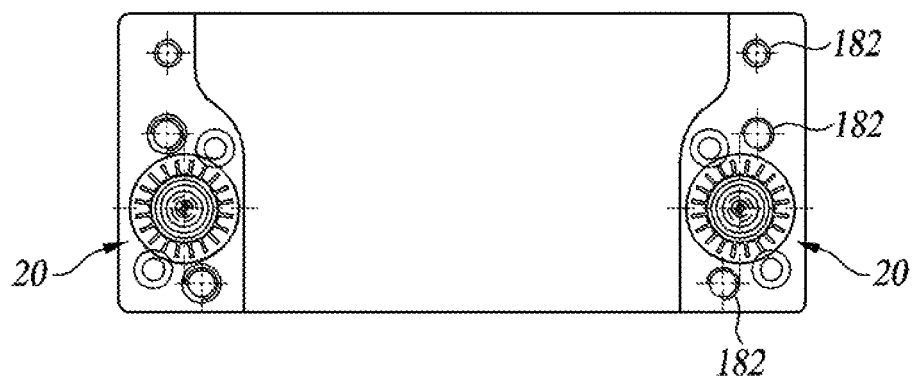
FIG. 3 is a perspective plan view of a structure of a cavity filter according to an embodiment of the present disclosure as seen from the bottom side.

FIG. 3 is a perspective plan view of a structure of a cavity filter according to an embodiment of the present disclosure as seen from the bottom side.

Figure 4:
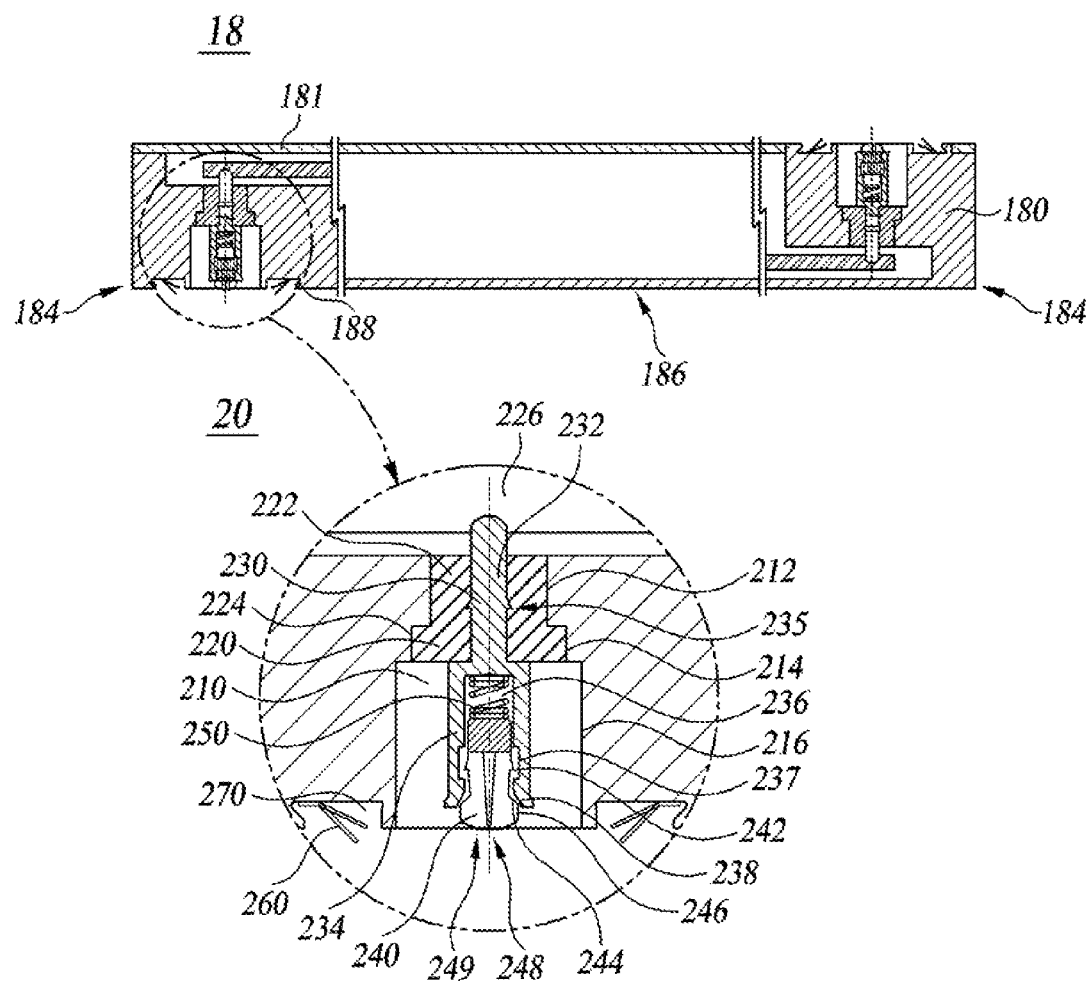
FIG. 4 is a cross-sectional view illustrating a terminal unit structure of a cavity filter employing a push pin type elastic connector according to an embodiment of the present disclosure.

FIG. 4 is a cross-sectional view illustrating a terminal unit structure of a cavity filter employing a push pin type elastic connector according to an embodiment of the present disclosure.

In FIGS. 3 and 4, an internal structure including a resonance element is omitted.

Referring to FIGS. 3 and 4, the cavity filter 18 according to an embodiment includes a first case 180 including a resonance element (not shown) and having a hollow interior, a second case 181 covering the first case 180, a terminal unit 20 provided on both longitudinal sides of the first case 180 arranged in a vertical direction of the cavity filter 18, and an assembly hole 182 provided on both sides of the terminal unit 20. The terminal unit 20 is arranged to pass through the first case 180 to electrically connect an external member, for example, an electrode pad of the PCB board 130 or the antenna board 150, to the resonance element.

Both side assemblies 184 including the first case 180 and the terminal unit 20 of the second case 181 may be formed to be thicker than the bottom surface 186, which is an area arranged therebetween, depending on the application. For example, when the bottom surface 186 of the first case 180 is connected to the PCB board 130, on which various devices are mounted, both side assemblies 184 may have a thickness avoiding interference between the first case 180 and the mounted devices. The external terminal of the terminal unit 20 may be formed such that one side thereof faces the lower end surface 188 of the first case 180 and the opposite side thereof protrudes from an assembly reference plane of the second case 181 as shown in FIG. 4. The external terminals of the terminal units 20 may be formed to be exposed in the same direction, for example, to the lower end face 188 of the first case 180 depending on the mounting form of the cavity filter 18.

Figure 5:
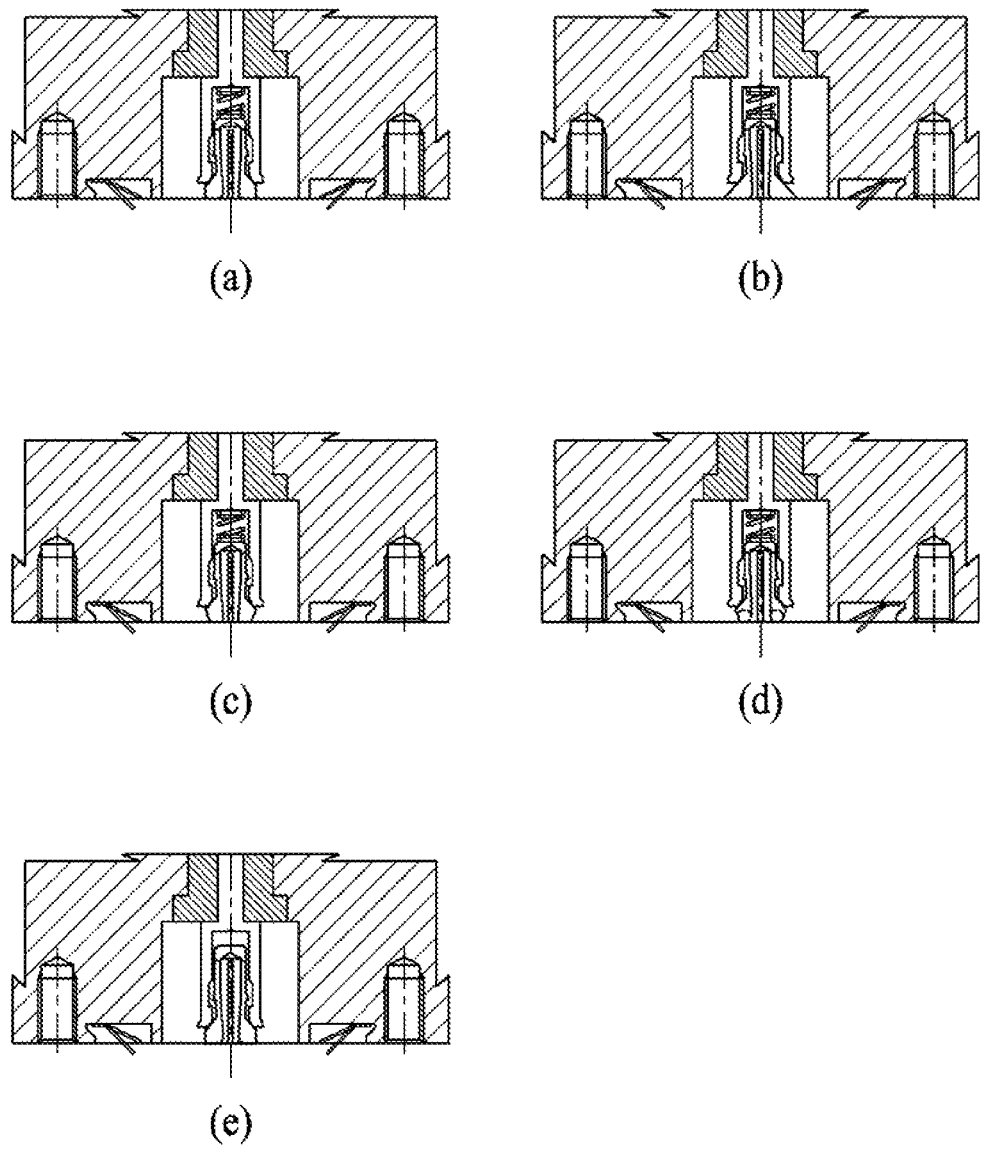
FIG. 5 is a side cross-sectional view illustrating a terminal unit structure of a cavity filter employing a push-pin type elastic connector according to an embodiment of the present disclosure.

FIG. 5 is a side cross-sectional view illustrating a terminal unit structure of a cavity filter employing a push-pin type elastic connector according to an embodiment of the present disclosure.

The terminal unit 20 of the cavity filter 18 according to an embodiment includes a terminal insertion hole 210, a dielectric bush 220, a pin member 230, an elastic connector 240, a pin spring 250, and a star washer 260.

The terminal insertion hole 210 may have a cylindrical shape and may be formed from the lower end surface 188 of the first case 180 by penetrating the first case 180 or formed from the upper end surface of the first case 180 by penetrating the first case 180. When the terminal insertion hole 210 is formed from the upper end surface of the first case 180, a through hole may also be formed in the second case 181, and the depth of the terminal insertion hole 210 may be adjusted in consideration of this hole. The terminal insertion hole 210 is formed to have three steps such that the diameter thereof gradually decreases stepwise. In the terminal insertion hole 210, a portion having the smallest diameter is defined as a first insertion hole 212, a portion having the next smallest diameter is defined as a second insertion hole 214, and a portion having the largest diameter is defined as a third insertion hole 216.

The dielectric bush 220 has a shape of a two-stage cylinder. The dielectric bush 220 is provided with a through hole 226 passing through the center of the rotary shaft. The dielectric bush 220 has a size so as to be inserted and fixed to the first insertion hole 212 and the second insertion hole 214. The dielectric bush 220 may be formed of Teflon. While it is illustrated in this embodiment that one body has a two-stage cylinder shape, the present disclosure is not limited thereto. Elements having different diameters may be formed and assembled to have a two-stage cylinder shape.

The pin member 230 includes a pin portion 232 and a terminal body portion 234, which are integrally formed in the longitudinal direction to have a two-stage cylinder shape. In one embodiment, the terminal body portion 234 is provided with a socket portion 236. The pin member 230 may be prepared by coating a beryllium copper (BeCu) alloy with gold. The pin portion 232 is fixedly inserted into the through hole 226 of the dielectric bush 220. A wedge-shaped protrusion 235 is formed on the outer circumferential surface of the fin portion 232 to prevent the pin portion 232 from being separated in the opposite direction to insertion of the fin portion 232. An annular step is formed at a boundary between the fin portion 232 and the terminal body portion 234 and arranged to contact one side surface of the dielectric bush 220. The terminal body portion 234 is formed to be shorter than the depth of the third insertion hole 216, and a hollow socket portion 236 is formed therein. The terminal body portion 234 is provided with a conical opening 238 whose diameter decreases from the inlet to the inside. In an embodiment of the present disclosure, the inner wall of the terminal body portion 234 in the region where the conical opening 238 is formed is inclined at an angle of, for example, 30 degrees with respect to the center axis. A first annular groove 237 may be formed inside the opening 238 to prevent the elastic connector 240 inserted thereinto from being separated. A spring 250 may be interposed between the innermost side surface of the opening 238 and the leading end of the insertion portion of the elastic connector 240 to further provide force to push the elastic connector 240 outwardly of the opening 238.

The elastic connector 240 includes a truncated conical pin socket contact 244 inserted into the socket portion 236 so as to correspond to the conical opening 238 having a cylindrical structure, and an impedance matching portion 246 extending from the pin socket contact 244, wherein the pin socket contact and the impedance matching portion are integrated with each other in the longitudinal direction. The elastic connector 240 may be formed by coating a BeCu alloy with gold. A wedge-shaped annular protrusion 242 protruding from the outer circumferential surface is formed in the longitudinal middle of the cylindrical structure. When the elastic connector 240 is inserted into the socket portion 236, the annular protrusion 242 is accommodated in the first annular groove 237 to prevent the elastic connector 240 from being separated from the socket portion 236.

The angle of the pin socket contact portion 244 with respect to the central axis is formed to be larger than the angle of the conical opening 238 of the socket portion 236 by 5 degrees to 10 degrees. In addition, the elastic connector 240 is provided with a cross-shaped cutoff part 248 that is locally formed along the central axis from the outer side surface of the elastic connector that is exposed to the outside after the elastic connector 240 is inserted into the socket portion 236. The depth of the cutoff part 248 extends up to the cylindrical structure of the elastic connector 240, passing through the truncated conical shape. While the cutoff part 248 is illustrated as having a cross shape in this embodiment, the present disclosure is not limited thereto. The cutoff part 248 may have a flat-head shape or a shape with a plurality of slots.

When the elastic connector 240 is inserted into the socket portion 236 and brought into contact with the conical opening 238 of the socket portion 236 without the cross-shaped cut-open part 248 being contracted, the elastic connector 240 may protrude from the lower end surface 188 of the first case 180. When the cavity filter 18 is mounted, the elastic connector 240 may press the opening 238 of the socket portion 236 to have an inserted length.

The outer edge of the outer surface of the elastic connector 240 is an area that is electrically connected to an electrode pad formed on the PCB 130, on which the cavity filter 18 is mounted, as the elastic connector 240 is contracted. This outer edge is defined as an electrode edge 249. In one embodiment, the electrode edge 249 may be formed in a round shape in the range of R0.1 to R0.5. Thus, even if the elastic connector 240 is contracted to form a shallow conical recessed outer surface with respect to a plane, the electrode edge 249 may have a uniform area of contact with the electrode pad formed on the PCB 130. The cavity filter 18 is substantially connected with the PCB 130 and may have various height deviations. By forming the electrode edge 249 in a round shape, the elastic connector 240 may have a uniform contact area even if there is a variation in degree of contraction of the elastic connector 240.

The angle of the opening 238, the angle of the pin socket contact portion 244, the length of the elastic connector 240, and the degree of roundness of the electrode edge 249 are preferably selected based on the state in which one side surface of the first case 180 or the assembly reference surface of the second case 181 is coupled with the PCB 130. More specifically, when the PCB 130 is coupled, the elastic connector 240 is pushed up to slide along the opening 238 of the socket portion 236 to contract the cross-shaped cut-open part 248. When the cut-open part 248 is contracted, the angle of the pin socket contact portion 244 of the elastic connector 240 is reduced, and the contact area of the opening 238 and the pin socket contact portion 244 is changed. In addition, as the outer surface of the elastic connector 240 is retracted in a shallow conical shape, the area of the electrode edge 249 that contacts the electrode pad of the PCB 130 is also changed. As the force by which the spring 250 inserted into the socket portion 236 urges the elastic connector 240 toward the PCB 130 and force including the reaction force from the pin socket contact portion 244 act on the respective contact points, the respective contact surfaces are elastically deformed.

The design specifications of the socket portion 236, the elastic connector 240, and the spring 250, which determine the contact area, are preferably selected in consideration of the impedance of the terminal unit 20. That is, design specifications that minimize the change in impedance along a signal path of the terminal unit 20 including the contact resistance determined by the contact area and the contact pressure is preferably determined. In particular, for a mobile communication antenna signal, which is transmitted at a high frequency, the signal quality may be degraded if the characteristic impedance of the signal line is not constant. For signals of a few gigahertz, impedance mismatching of the signal path may increase the voltage standing wave ratio (VSWR), thereby degrading signal quality due to signal reflection and distortion.

Considerations for maintaining uniform impedance of the terminal unit 20 are also necessary in determining the sizes of the first insertion hole 212 to the third insertion hole 216 and the size of the terminal body portion 234. The third insertion hole 216 and the outer circumferential surface of the terminal body portion 234 are spaced apart from each other by a predetermined air gap, and the dielectric bush 220 formed of, for example, PTFE is interposed between the first and second insertion holes 212 and 214 and the pin portion 232. The pin portion 232 and the terminal body portion 234 of the pin member 230 form a radial step, and the diameter and depth of the second insertion hole 214 are preferably determined in consideration of the step such that the impedance between the pin member 230 and the terminal insertion hole 210 is kept constant.

The diameter of the third insertion hole 216 is formed to be larger than the diameter of the first and second insertion holes 212 and 214 in consideration of the dielectric constant of PTFE, which is about twice that of air. For example, if the dielectric bush 220 is made of PEEK, whose dielectric constant is about three times that of air, instead of PTFE, the diameter of the third insertion hole 216 is formed to be larger than in the case of PTFE.

FIGS. 5(a) to 5(d) illustrate various shapes of the electrode edge 249 and the impedance matching portion 246 of the elastic connector 240 which is in contact with the electrode pad of the PCB 130. These shapes and sizes may be selected by performing numerical analysis in consideration of a gap with the third insertion hole 216 or by evaluating the VSWR of the terminal unit 20 using, for example, a network analyzer.

In the example of FIG. 5(a), the impedance matching portion 246 has a shape vertically protruding at a position deviating from the pin socket contact portion 244, and the electrode edge 249 is formed with fine roundness of R0.1. In the example of FIG. 5(b), the impedance matching portion extends to the electrode edge 249 while the pin socket contact portion 244 of the elastic connector 240 maintains the inclination angle thereof. In the example of FIG. 5(c), the impedance matching portion 246 has an inclined surface whose diameter decreases at a position deviating from the pin socket contact portion 244. In the example of FIG. 5(d), the impedance matching portion has an inclined surface whose diameter decreases at a position deviating from the pin socket contact portion 244, and the electrode edge 249 has relatively high roundness of R0.5. FIG. 5(e) shows a case where the spring 250 is omitted. In this example, the force (contact pressure) to push the elastic connector 240 and the electrode pad of the PCB 130 in contact therewith is formed by the reaction force from the pin socket contact portion 244 as the cross-shaped cut-open part 248 is contracted.

A second annular groove 270 may be formed on the outer side of the third insertion hole 216 to surround the signal line and accommodate the star washer 260, which surrounds the cylindrical portion and is inserted so as to secure the ground connection.

Embodiment 2

Figure 6:
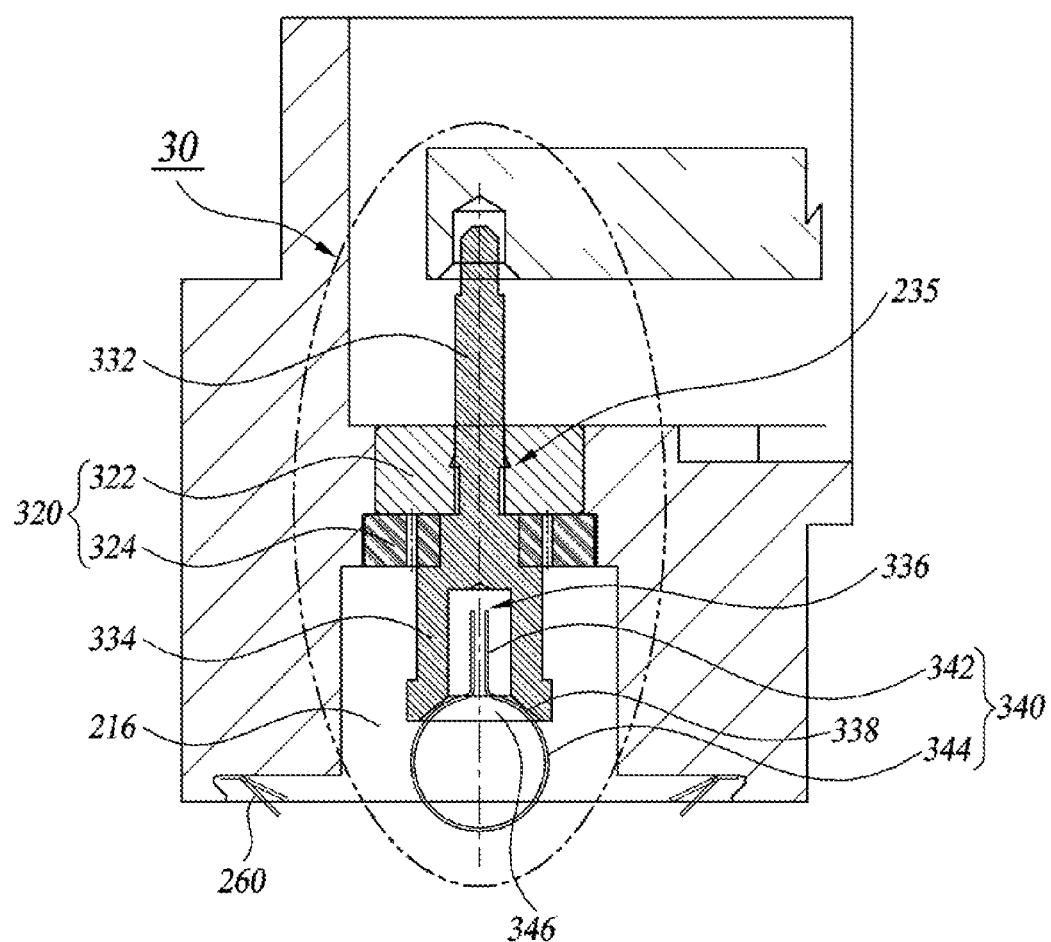
FIG. 6 is a partial cross-sectional view of a terminal unit structure of a cavity filter employing a push ring type elastic connector according to an embodiment of the present disclosure.

FIG. 6 is a partial cross-sectional view of a terminal unit structure of a cavity filter employing a push ring type elastic connector according to an embodiment of the present disclosure.

Referring to FIG. 6, the terminal unit 20 according to another embodiment of the present disclosure includes a terminal insertion hole 210, a dielectric bush 320, a pin member 330, a push ring-type elastic connector 340, and a star washer 260. In the embodiment of FIG. 6, which illustrates a case in which impedance matching is performed more strictly, it is illustrated that the dielectric bush 220 is formed to be separable, the through hole 226 of the dielectric bush 320 having two stages are formed to have different diameters, and the pin portion 332 of the pin member 330 is formed to have two steps corresponding to the dielectric bush 320. However, the terminal insertion hole 210, the dielectric bush 320, the pin portion 332 and the star washers 260 may be formed to have the same shapes as in the embodiment of FIG. 4.

The pin member 330 according to one embodiment includes a pin portion 332 and a terminal body portion 334 provided with a socket portion 336. The pin member 330 may be formed of a BeCu material plated with gold. The pin portion 332 is fixedly inserted into the through hole 226 of the dielectric bush 320. A wedge-shaped protrusion 235 is formed on the outer circumferential surface of the pin portion 332 to prevent the pin member 330 from being separated in the opposite direction to insertion of the pin member 330. An annular step formed at the boundary between the pin 332 and the terminal body portion 334 is disposed to contact one side surface of the dielectric bush 320. The terminal body portion 334 is formed to be shorter than the depth of the third insertion hole 216, and the inside thereof is hollow. The terminal body portion is provided with a conical opening 338 whose diameter is reduced inward from the inlet. In an embodiment of the present disclosure, the conical opening 338 is formed to be inclined at, for example, 60 degrees with respect to the central axis such that a circular spring portion 344 of the push ring-type elastic connector 340 is circumscribed about the opening.

The pushing-type elastic connector 340 according to the embodiment is formed of a spring plate having a constant width over most of the length thereof except both ends thereof. The elastic connector 340 includes a circular spring portion 344 provided on one side and two plate-shaped protrusions 342 protruding from two adjacent points 346 on the circumference of the circular spring portion 344 perpendicularly with respect to the circumference. The elastic connector 340 is formed to have a width allowing the plate-shaped protrusions 342 to be inserted into the socket portion 336. The elastic connector 340 may be formed of a BeCu material plated with gold. The two plate-shaped protrusions 342 are stretched away from each other, and the circular spring portion 344 operates as a leaf spring so as to be deformed into an ellipse when an external force acts thereon toward the center thereof.

That is, when the two plate-shaped protrusions 342 of the elastic connector 340 are inserted into the socket portion 336, the two plate-shaped protrusions 342 may be stretched away from each other, and thus the end portions of the two plate-shaped protrusions 342 may come into close contact with the inner circumferential surface of the socket portion 336, thereby maintaining the inserted state. The circular spring portion 344 is brought into close contact with the conical opening 338 in a circumscribing manner, and the opposite side positions of the plate-shaped protrusions 342 protrude from the lower end surface 188 of the first case 180 by a predetermined distance. Thus, when the cavity filter 18 is mounted, the electrode pad presses the circular spring portion 344, and thus the circular spring portion is elastically deformed into an elliptical shape to electrically connect the pin member 330 and the electrode pad to each other. Here, sufficient contact pressure is applied to the contact portions such that the contact state remains unchanged even if external vibration is applied.

Figure 7:
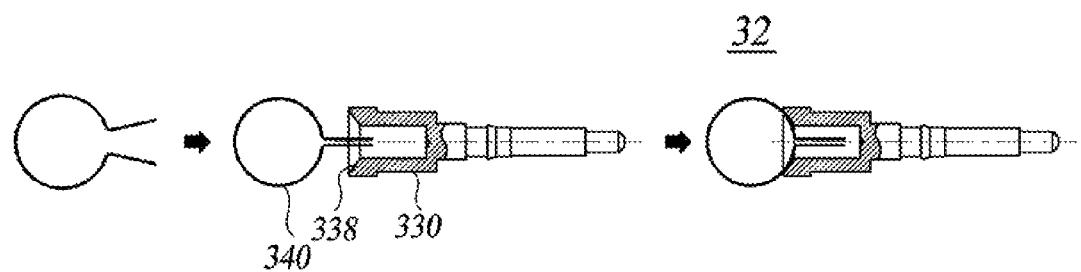
FIG. 7 is a cross-sectional view illustrating a process of assembling a pin assembly employing a push ring-type elastic connector according to an embodiment of the present disclosure.

FIG. 7 is a cross-sectional view illustrating a process of assembling a pin assembly employing a push ring-type elastic connector according to an embodiment of the present disclosure.

Figure 8:
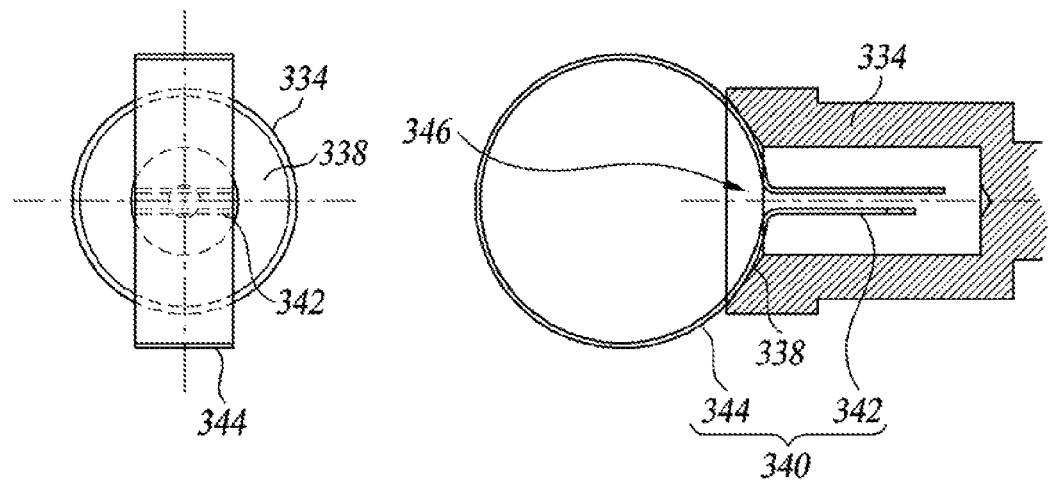
FIG. 8 is a plan view and partial cross-sectional view showing a pin assembly employing a push ring-type elastic connector according to an embodiment of the present disclosure.

FIG. 8 is a plan view and partial cross-sectional view showing the pin assembly employing a push ring-type elastic connector according to an embodiment of the present disclosure.

Referring to FIGS. 7 and 8, the push ring-type elastic connector 340 is inserted into the socket portion 336. Preferably, the two plate-shaped protrusions 342 inserted into the cylindrical holes in the socket portion 336 are connected by soldering and joined to the pin assembly 32. A preferred embodiment of joining the elastic connector 340 and the pin member 330 according to one embodiment is disclosed below.

When multiple pin members 330 are prepared such that the openings 338 of the socket portions 336 of the pin members 330 are positioned on the upper side, a certain amount of solder is inserted into the socket portions 336 and the pin members 330 are heated such that the solder is melted. Then, the elastic connector 340 is inserted. The elastic connector 340 inserted into the socket portion 336 is held in position until the solder cools and solidifies. When the solder is hardened, joining of the elastic connector 340 and the pin member 330 is completed. The cavity filter 18 handles high frequency signals at the gigahertz level. It is preferable to minimize portions which may make incomplete mechanical contact in transmitting signals of such a frequency band.

It is important for antennas of a mobile communication base station in which the cavity filter 18 is used to secure extremely low noise in the operating frequency band. Accordingly, it is necessary to minimize the passive intermodulation distortion (PIMD) caused not only at the mechanical connection portions of various RF connection elements, but also at portions where metal contact is made and inside parts coated with different kinds of metal. Particularly, a radio signal having a high frequency and a high energy may cause an intermediate frequency by mixing of multiple frequencies due to nonlinearity of voltage and current at such contact portions. Signal quality of the antennas may be greatly degraded by an intermediate frequency which is closer to the frequency of a main signal than the other intermediate frequencies. The PIMD may be minimized by firmly joining the plate-shaped protrusions 342 inserted into the socket portion 336 by soldering.

The pin assembly 32 employing the push ring-type elastic connector according to the embodiment of the present disclosure is electrically and physically connected by soldering as described above. The pin assembly is connected to the electrode pad of the PCB substrate on which the cavity filter 18 is installed in the form of a circular leaf spring. Particularly, the circular spring portion 344 provides stable mechanical connection with the electrode pad, and the signal line undergoes a small change in impedance. Accordingly, performance of low signal reflection is implemented with a simple component structure.

Figure 9:
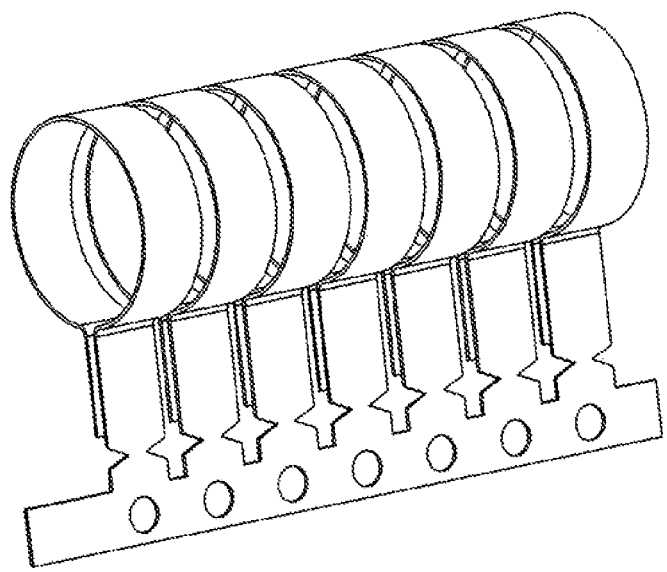
FIG. 9 is a conceptual view illustrating a method of manufacturing a push ring-type elastic connector according to an embodiment of the present disclosure.

FIG. 9 is a conceptual view illustrating a method of manufacturing a push ring-type elastic connector according to an embodiment of the present disclosure.

Referring to FIG. 9, the elastic connector 340 according to an embodiment may be formed by press-forming a sheet metal from a spring plate material and subjecting the press-formed metal to heat treatment such that a plurality of elastic connectors 340 is connected to each other on one side so as to be easily separated from each other by bending. Since the circular spring portion 344 is a part that contacts the opening 338 of the socket portion 336 and the electrode pad, the circular spring portion is preferably processed such that the burr of the edge portion can be generated only inwardly of the circular portion by fine blanking.

The diameter of the circular spring portion 344 is determined based on the outer diameter of the terminal body portion 334. The circular spring portion 344 is brought into close contact with the conical opening 338 of the socket portion 336 at two points, and is spaced apart from the inner circumferential surface of the third insertion hole 216 to have a predetermined characteristic impedance. The diameter of the circular spring portion 344 is preferably formed such that the impedance is equal or similar to the characteristic impedance between the outer diameter of the terminal body portion 334 and the third insertion hole 216. For signals of a few gigahertz, impedance mismatch of the signal path may increase the voltage standing wave ratio (VSWR), thereby degrading signal quality due to signal reflection and distortion. Accordingly, change in impedance is preferably minimized.

The circular spring portion 344 contacts the electrode pad at the circular portion side thereof and is bifurcated to be electrically connected to the opening 338 of the socket portion 336. The circular spring portion 344 may have a diameter determined to be greater than or equal to the width thereof and less than or equal to twice the width thereof, it may be seen as electrical extension of one cylindrical electrode, when viewed from the inner circumferential surface of the third insertion hole 216 corresponding to the ground electrode. In other words, even if the circular spring portion 344 is connected to the socket portion 336 in the band of a high frequency signal transmitted from the cavity filter 18 according to the present disclosure, variation of the impedance may be small.

FIGS. 10 to 17 illustrate RF characteristics and electric field shapes of various types of contact type RF terminal units 20 which are compared with each other through computer simulation. The right side of the analysis model is the terminal unit 20, and the left side is a cylindrical terminal corresponding to an electrode pad. A cylindrical ground terminal is disposed to surround the terminal unit and the electrode pad.

Figure 10:
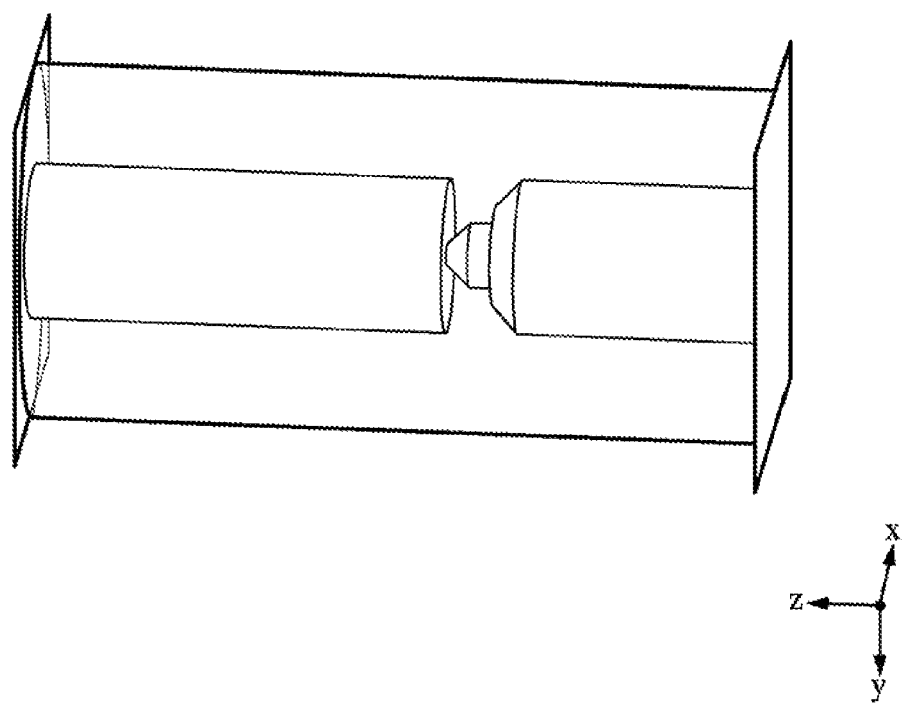
FIG. 10 is an analytical model of a typical plunger type terminal unit for comparison.

FIG. 10 is an analytical model of a typical plunger type terminal unit for comparison.

Figure 11:
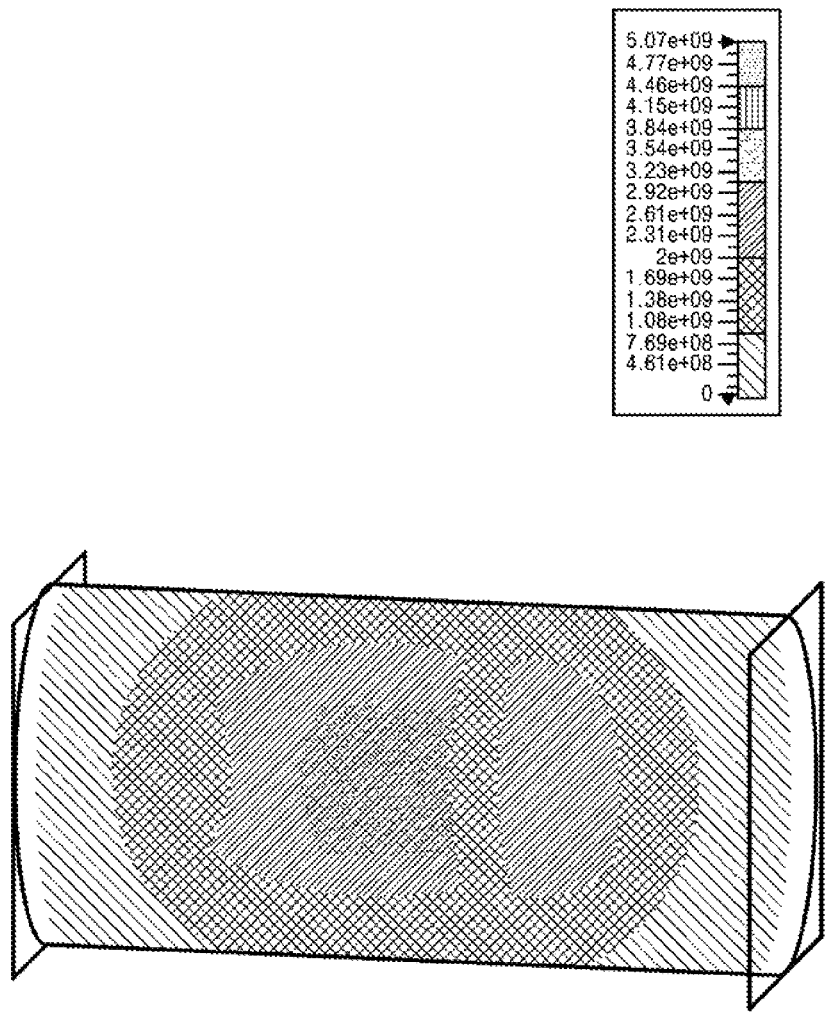
FIG. 11 shows a result of electric field analysis of the typical plunger-type terminal unit of FIG. 10.

FIG. 11 shows a result of electric field analysis of the typical plunger-type terminal unit of FIG. 10.

Referring to FIG. 11, it can be seen that the terminal unit of the conventional typical plunger structure has a disconnected portion in the middle of the electric field distribution due to structural limitations. The pin portion supported by the spring may have a considerably smaller diameter than the pin housing for accommodating the pin due to the structure thereof and inevitably have a section where the gap becomes abruptly wide with respect to the inner circumferential surface of the cylindrical ground end. As a result, the diameter of the protruding pin portion is smaller than the outer diameter of the plunger body, which results in a sudden change in impedance. Thereby, the terminal unit of the typical plunger structure has a high insertion loss S21 and a high reflection loss S11.

The analysis result shows that the insertion loss is −0.006 dB and the reflection loss is −28 dB at 4 GHz. This result may be interpreted as meaning that reflection of the signal is large due to the impedance variation area in the middle of the signal path.

Figure 12:
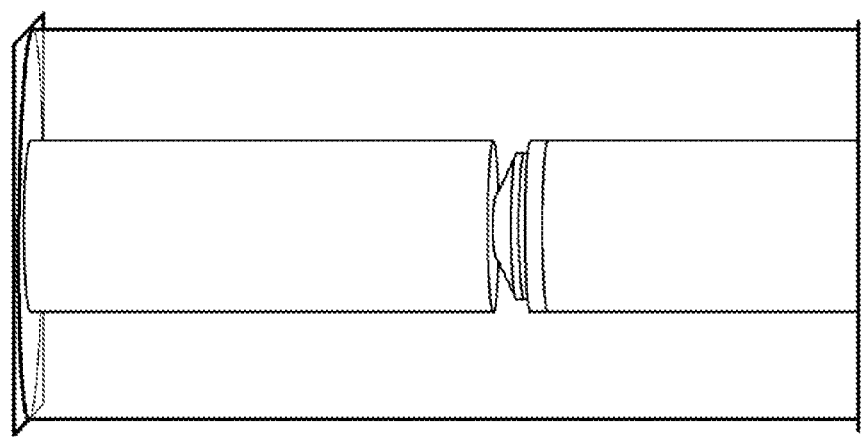
FIG. 12 is an analytical model of a terminal unit employing a push-pin type elastic connector according to an embodiment of the present disclosure.
Figure 12:
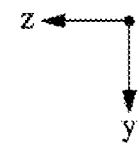

FIG. 12 is an analytical model of a terminal unit employing a push-pin type elastic connector according to an embodiment of the present disclosure.

Figure 13:
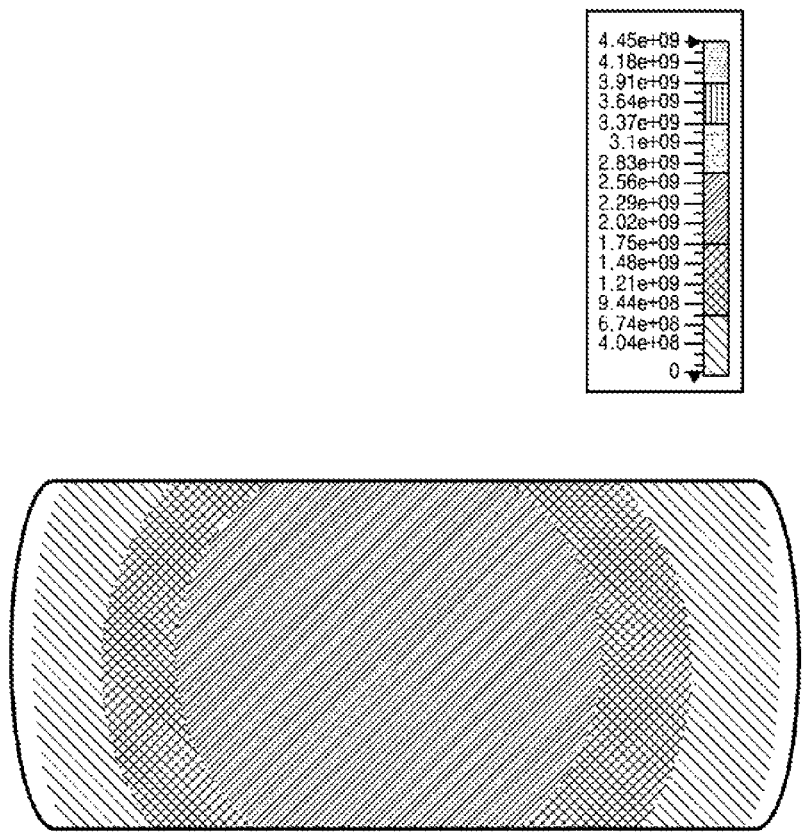
FIG. 13 shows a result of electric field analysis of a terminal employing a push-pin type elastic connector according to an embodiment of the present disclosure.

FIG. 13 shows a result of electric field analysis of a terminal employing a push-pin type elastic connector according to an embodiment of the present disclosure.

Referring to FIG. 13, in the case of the terminal unit 20 employing a push pin-type elastic connector according to the embodiment of the present disclosure, the distribution of the electric field is relatively uniform. The push pin-type elastic connector can maintain the gap of the impedance discontinuity section to be relatively narrow as to, for example, 0.5 mm or less, and be formed to be similar to the outer diameter of the terminal body portion 234 with reference to the inner circumferential surface of the third insertion hole 216, which is advantageous for minimization of variation in impedance. According to the analysis result, the insertion loss is −0.0003 dB and the reflection loss is −41 dB at 4 GHz.

Figure 14:
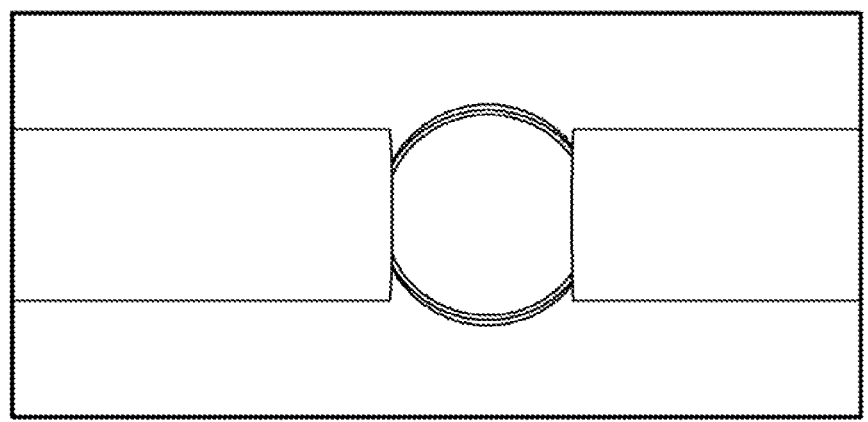
FIG. 14 is an analytical model of a terminal unit employing a push ring-type elastic connector according to an embodiment of the present disclosure.
Figure 14:
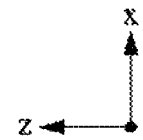

FIG. 14 is an analytical model of a terminal unit employing a push ring-type elastic connector according to an embodiment of the present disclosure.

Figure 15:
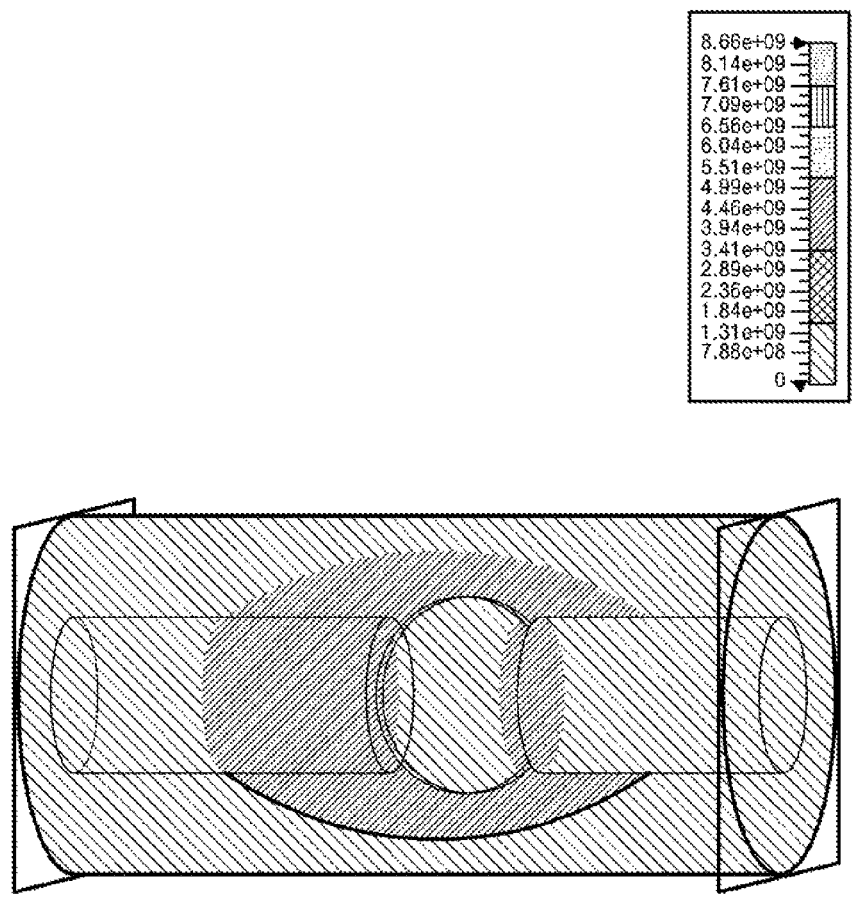
FIG. 15 shows a result of electric field analysis of a terminal unit employing a push ring-type elastic connector according to an embodiment of the present disclosure.

FIG. 15 shows a result of electric field analysis of a terminal unit employing a push ring-type elastic connector according to an embodiment of the present disclosure.

Referring to FIG. 15, in the case of the terminal unit 30 employing a push ring-type elastic connector according to the embodiment of the present disclosure, the pin assembly 32 may form a relatively uniform electric field together with the inner circumferential surface of the third insertion hole 216. It can also be seen that while a different magnetic field is formed inside the spring portion 344, the distribution of the electric field is formed at the outer periphery of the circular spring portion 344 and change of the electric field continuously occurs with respect to the inner circumferential surface of the third insertion hole 216. In other words, there is no section in which the impedance of the signal line changes discontinuously, and accordingly the insertion loss and the reflection loss may be kept low. The circular spring portion 344 may be designed to have various sizes because it has a simple structure while securing a sufficient contact pressure. Thereby, impedance matching may be facilitated. According to the analysis result, the insertion loss is −0.003 dB and the reflection loss is −31 dB at 4 GHz.

Figure 16:
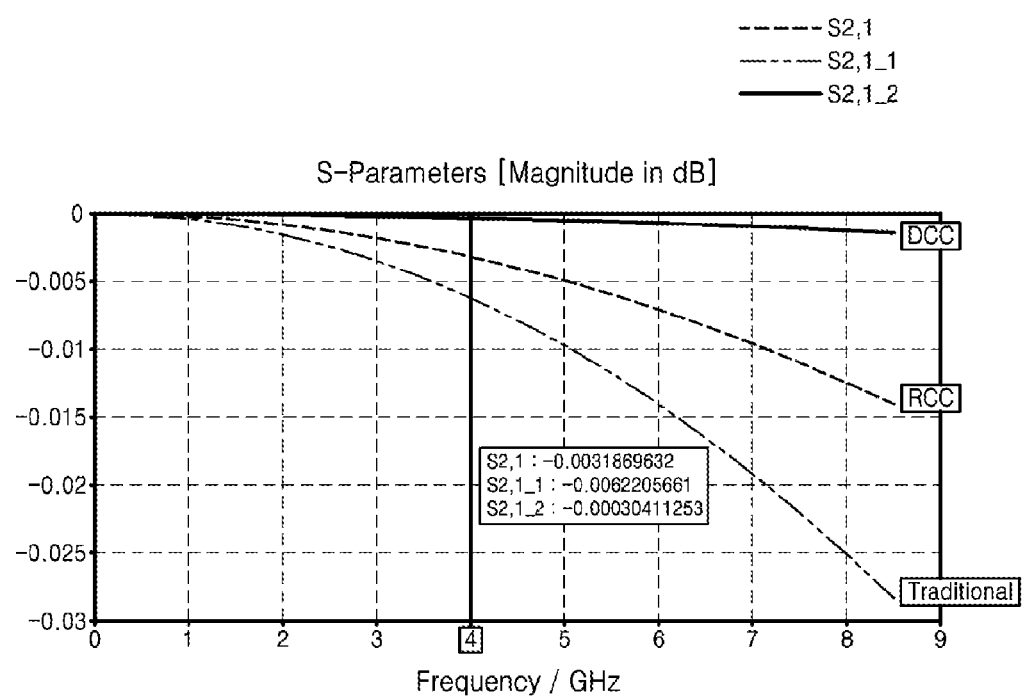
FIG. 16 is a graph showing and comparing the results of analysis of insertion losses of the contact-type RF terminal units disclosed in FIGS. 10, 12 and 14.

FIG. 16 is a graph showing and comparing the results of analysis of insertion losses of the contact-type RF terminal units disclosed in FIGS. 10, 12 and 14.

Figure 17:
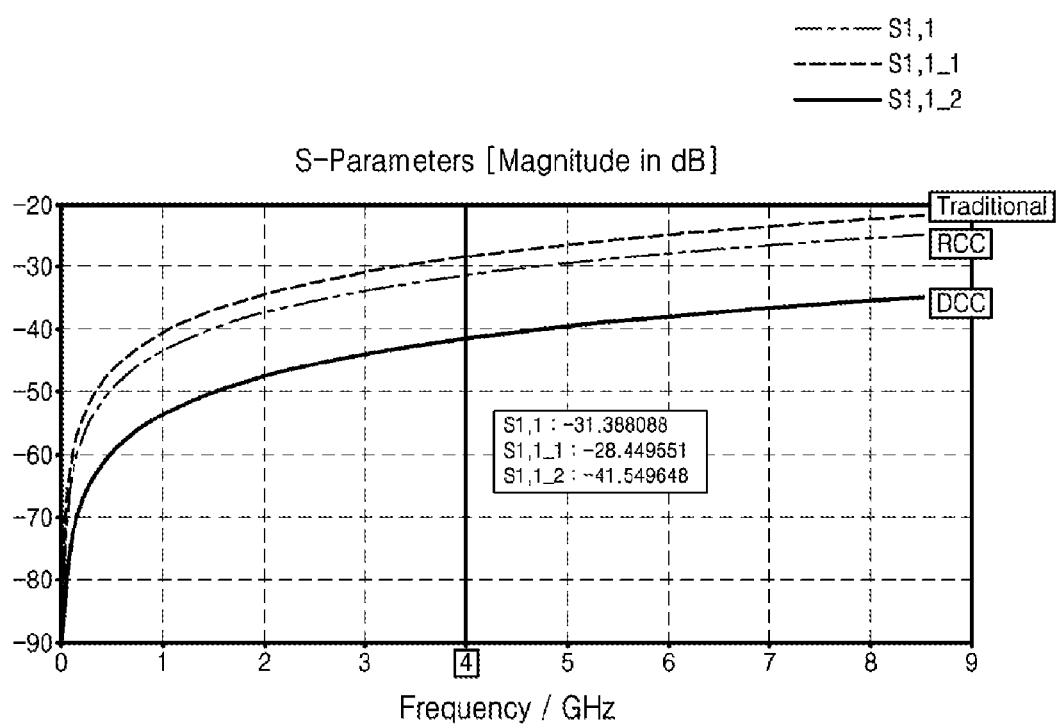
FIG. 17 is a graph showing and comparing the results of analysis of reflection losses of the contact-type RF terminal units disclosed in FIGS. 10, 12 and 14.

FIG. 17 is a graph showing and comparing the results of analysis of reflection losses of the contact-type RF terminal units disclosed in FIGS. 10, 12 and 14.

Referring to FIGS. 16 and 17, the above-described three types of terminal units may be compared with each other in terms of insertion loss and reflection loss. It can be seen that the terminal unit 20 having the push pin structure exhibits the best signal quality and the terminal unit 30 having the push ring structure exhibits sufficient performance in practical use.

In the above-mentioned comparison, the influence of PIMD generated due to incomplete inner contact between the typical plunger type pin portion and the pin housing is not considered in the analysis. Considering this fact, the signal transmission quality may be further degraded in the typical plunger structure. On the other hand, both contact portions of the terminal unit 20 having the push pin structure are brought into annular surface contact by the elastic connector 240 and is made to make firm contact by elasticity. The terminal unit 30 having the push ring structure is directly joined to the socket portion 336 by soldering, and stable contact with the PCB 130 is secured by the elasticity of the circular spring portion 344. Accordingly, in both cases, a uniform signal quality may be maintained without increasing the PIMD even when external vibration is applied.

Embodiment 3

Figure 18:
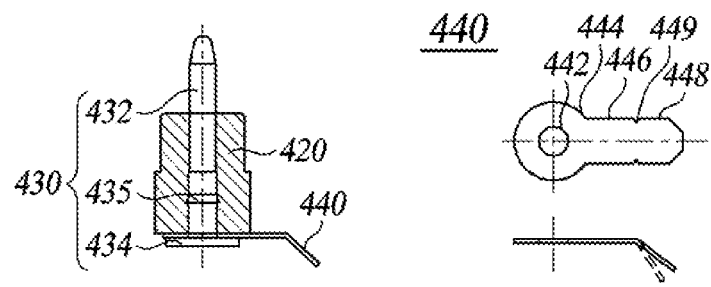
FIG. 18 is a conceptual diagram showing a terminal unit structure of a cavity filter employing a leaf spring-type elastic connector according to an embodiment of the present disclosure.
Figure 18:
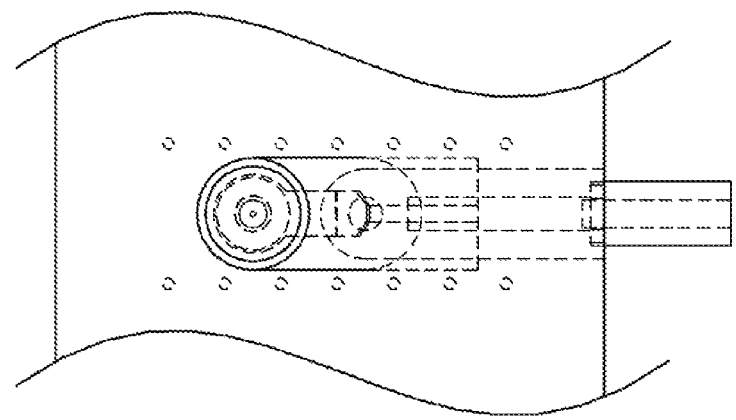
Figure 18:
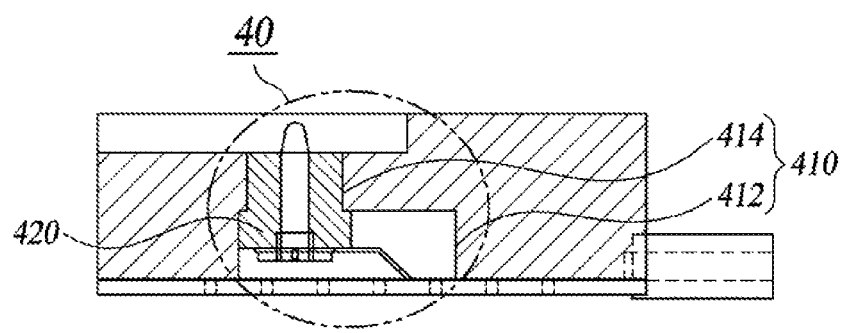

FIG. 18 is a conceptual diagram showing a terminal unit structure of a cavity filter employing a leaf spring-type elastic connector according to an embodiment of the present disclosure.

FIG. 18(a) shows a pin member structure, which is inserted into the terminal insertion hole 410 of the cavity filter 18, and a leaf spring, and FIG. 18(b) is a plan view showing a plate spring contact portion, and FIG. 18(c) is a side view showing the leaf spring contact portion.

Referring to FIG. 18, a leaf spring-type terminal unit 40 according to another embodiment of the present disclosure includes a terminal insertion hole 410, a dielectric bush 420, a pin member 430, and a leaf spring-type elastic connector 440.

The terminal insertion hole 410 of the embodiment includes a fourth insertion hole 412 and a fifth insertion hole 414. The fourth insertion hole has an elongated cross section extending from the lower end surface of the first case 180 to accommodate the leaf spring-type elastic connector 440, and the fifth insertion hole 414 is formed a cylindrical shape at the central position of one side of the elongated shape of the fourth insertion hole 412. The fourth insertion hole 412 is shown as a rectangular area in FIG. 18(c).

The dielectric bush 420 has a two-stage cylindrical shape and has a through hole formed through the center of the axis of rotation. The first stage of the dielectric bush 420 is formed to have a diameter allowing the first stage to be inserted into the fifth insertion hole 414, and the second stage, which has a diameter larger than that of the first stage of the dielectric bush 420, is formed to be at least partially inserted into one side of the fourth insertion hole 412. The height of the second stage of the dielectric bush 420 is set to form a predetermined gap between the dielectric bush and one side surface or ground electrode surface of the PCB 130, to which the cavity filter 18 is coupled after the elastic connector 440 and the pin member 430 are disposed, such that the terminal unit 40 has a constant impedance. The dielectric bush 420 may be formed of PTFE. The outer diameter of the first stage of the dielectric bush 420 and the size of the through hole are determined in consideration of the dielectric constant of the dielectric bush 420 such that the terminal unit 40 has a predetermined characteristic impedance.

The pin member 430 includes a pin portion 432 fixedly inserted into the dielectric bush 420 through the elastic connector 440, and a head portion 434 with a low height which brings the elastic connector 440 into close contact with the dielectric bush 420. A wedge-shaped protrusion 435 is formed on the outer circumferential surface of the pin portion 432 to prevent the pin member 430 from being separated in the direction opposite to the insertion direction thereof. The pin member 430 may be formed of a BeCu material plated with gold.

The elastic connector 440 of the leaf spring-type according to one embodiment includes an annular portion 444 having a through hole 442 formed at the center thereof, and a first extension 446 extending from one side of the annular portion 444 with a narrower width than the annular portion 444, a second extension 448 bent from the first extension 446 at an obtuse angle (for example, 120 to 130 degrees) with respect to the first extension 446 and extending such that the elastic connector 440 protrudes outward from the lower end surface 188 of the first case 180, and a bent portion 449 formed between the first extension 446 and the second extension 448. The leading end of the second extension 448 is formed to maintain a predetermined contact area by pressing the electrode pad of the PCB 130, which is configured to contact the leading end.

Both sides of the bent portion 449 are provided with notches so as to be bent at a uniform position and angle. The leaf spring-type elastic connector 440 may be bent about the bent portion 449, providing elastic force in the bending direction. The through hole 442 is formed to have a size allowing only the pin portion 432 of the pin member 430 to pass therethrough. When the elastic connector 440 is connected to the dielectric bush 420, the annular portion 444 is arranged between and brought into close contact with the head portion 424 and the second stage of the dielectric bush 420 such that the elastic connector 440 and the pin member 430 are electrically connected to each other. A conductive paste may be applied between the elastic connector 440 and the pin member 430 or soldering may be performed to ensure more firm connection therebetween.

The electrode pad of the PCB 130 to which the leaf spring-type terminal unit 40 is electrically connected may be formed as a circular electrode pad which contacts the leading end of the second extension 448. In addition, by arranging a plurality of plated through vias passing through the PCB 130 in the circular electrode pad at proper intervals and pitches, variation in impedance may be minimized.

Figure 19:
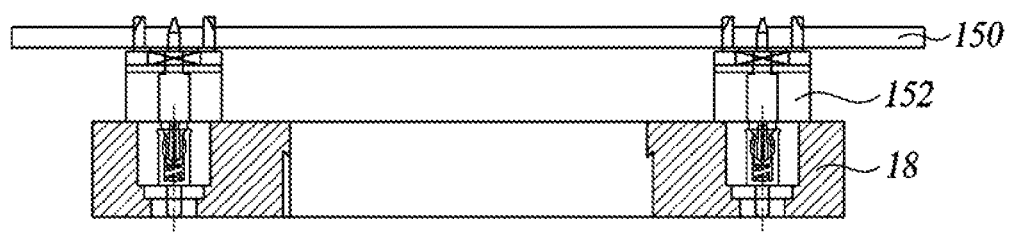
FIG. 19 is a cross-sectional view showing a cavity filter according to an embodiment of the present disclosure, which is attached to a socket on the back surface of an antenna board.

FIG. 19 is a cross-sectional view showing a cavity filter according to an embodiment of the present disclosure, which is attached to a socket on the back surface of an antenna board.

Figure 20:
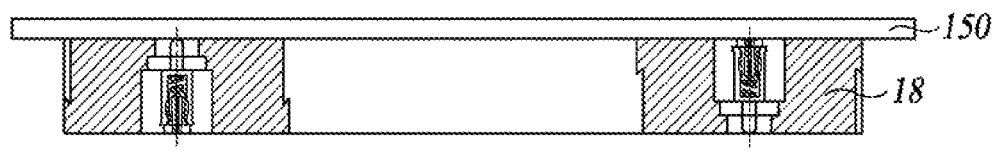
FIG. 20 is a cross-sectional view showing a cavity filter according to an embodiment of the present disclosure, which is attached to the back surface of an antenna board.

FIG. 20 is a cross-sectional view showing a cavity filter according to an embodiment of the present disclosure, which is attached to the back surface of an antenna board.

Referring to FIGS. 19 and 20, the cavity filter 18 according to an embodiment of the present disclosure may be coupled to a socket 152 attached to an antenna board 150 as shown in FIG. 19, or may be brought into direct contact with the electrode pad formed on the antenna board 150 as shown in FIG. 20. The cavity filter 18 according to the embodiment may be connected to the antenna board 150 and the PCB 130 at a certain level of contact pressure due to the elastic connector 240, 340, 440 to provide RF signal line connections with a constant quality regardless of assembly tolerance.

A plurality of cavity filters 18 is used for a base station antenna apparatus 10 as the cavity filter 18 is mounted on each antenna 160. Precisely and quickly tuning and verifying the cavity filters 18 may be an important factor for improving the quality of the base station antenna apparatus 10 and reducing the cost.

The cavity filters 18 including the terminal units 20, 30, 40 with the elastic connectors 240, 340, 440 according to with an embodiment of the present disclosure provides a highly reproducible RF signal line connection. It is not necessary to provide a coupling screw or a snap lock member in the RF connection portion, and the elasticity of the elastic connectors 240, 340 and 440 cause the electrode pad of the PCB board 130 to be disposed and the RF connection portion to make close contact with each other so as to be connected to each other and enables quick attachment/detachment thereof.

Figure 25:
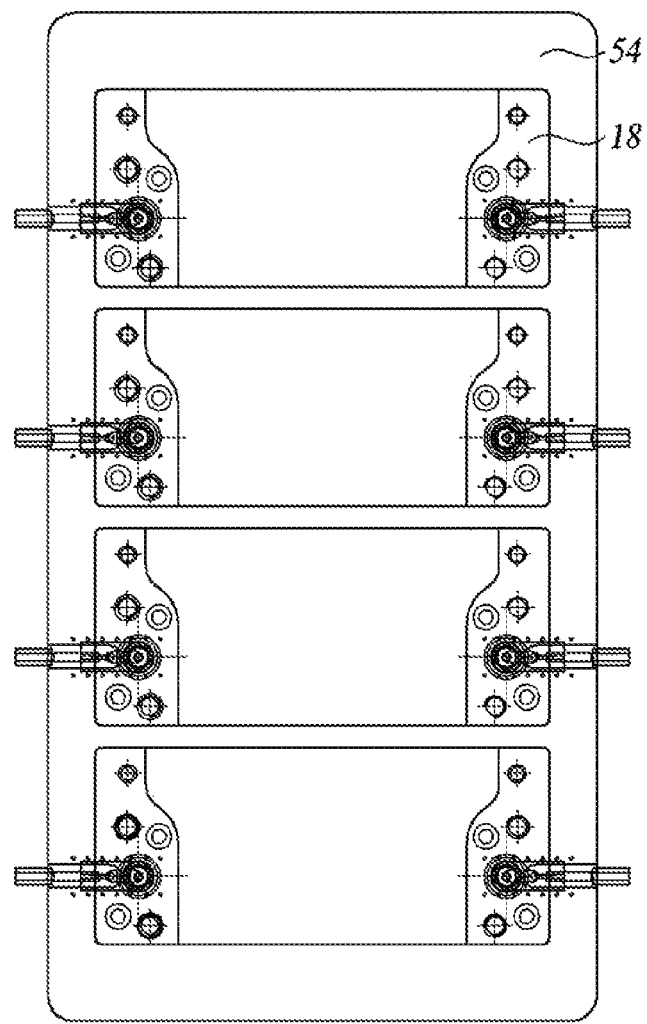
FIG. 25 is a plan view showing a test board of a cavity filter employing a leaf spring-type elastic connector according to an embodiment of the present disclosure.
Figure 26:
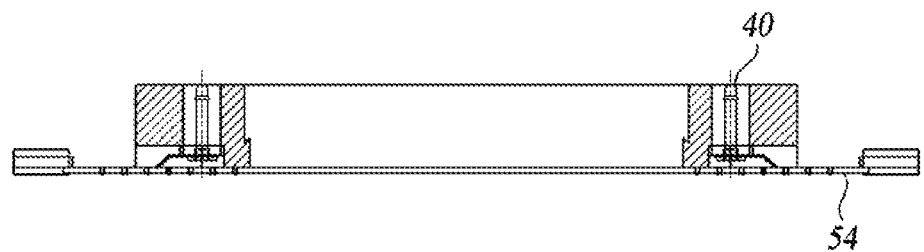
FIG. 26 is a cross-sectional view showing the test board of the cavity filter of FIG. 25 employing a leaf spring-type elastic connector.

Next, verification of the cavity filter 18 will be described on the assumption that the terminal units 20, 30, 40 of the cavity filter 18 are arranged in the same direction. Even when the terminal units 20, 30, 40 are arranged in the opposite directions, connection of the RF signal lines may be performed quickly and easily. FIGS. 21 to 24 illustrate cases of cavity filters 18 employing the push pin-type and push ring-type elastic connectors 240 and 340, and FIGS. 25 and 26 illustrate a case of a cavity filter 18 employing the leaf spring-type elastic connector 440.

Figure 21:
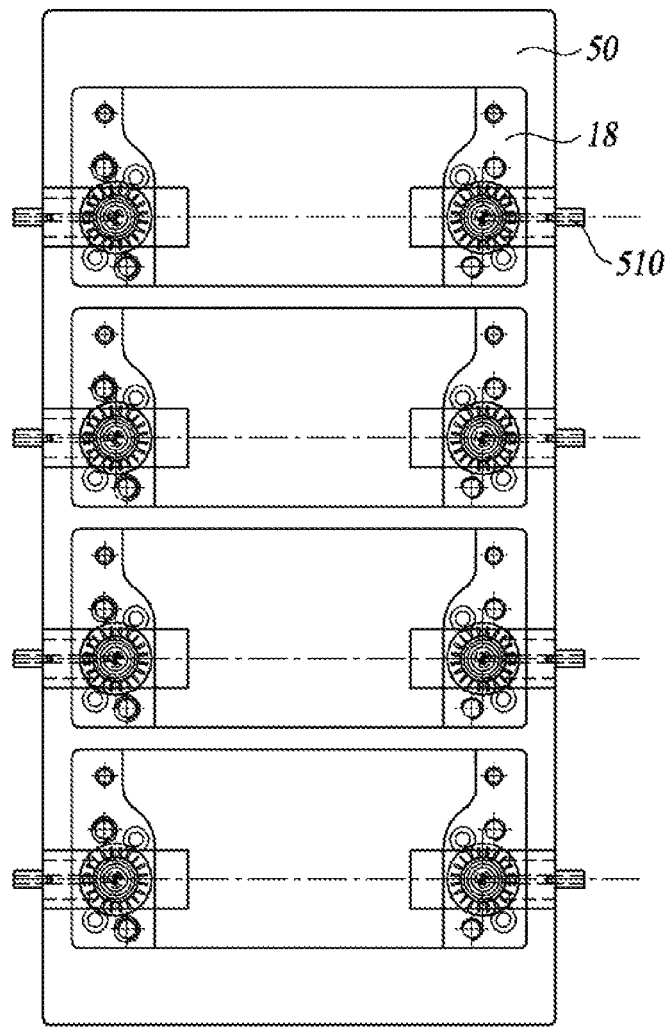
FIG. 21 is a plan view showing a test board of a cavity filter according to an embodiment of the present disclosure.

FIG. 21 is a plan view showing a test board of a cavity filter according to an embodiment of the present disclosure.

Figure 22:
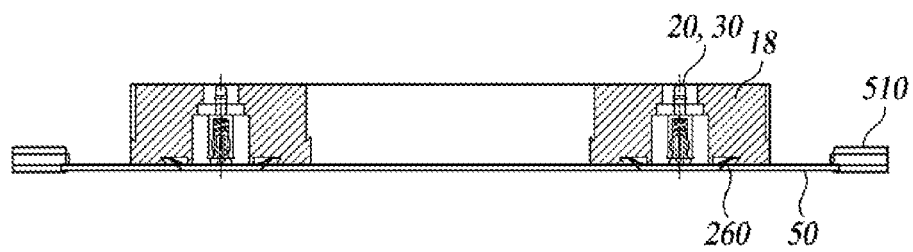
FIG. 22 is a cross-sectional view showing a test board of a cavity filter according to an embodiment of the present disclosure.

FIG. 22 is a cross-sectional view showing a test board of a cavity filter according to an embodiment of the present disclosure.

FIGS. 21 and 22 illustrate four cavity filters 18 mounted on a test board 50 of the cavity filter 18 and conceptually shows SMA RF connectors 510 mounted on the left and right sides. The test board 50 of the cavity filter 18 is provided with a circular electrode pad that makes an electrical contact with the elastic connectors 240 and 340, a plated through via is connected to the rear surface of the test board 50 by bypassing the contact areas of the elastic connectors 240 and 340 of the circular electrode pad, and is then connected to a center terminal of the SMA RF connector 510. A device such as a network analyzer may be connected to the SMA RF connector 510 to enable rapid verification of a plurality of cavity filters 18.

Figure 23:
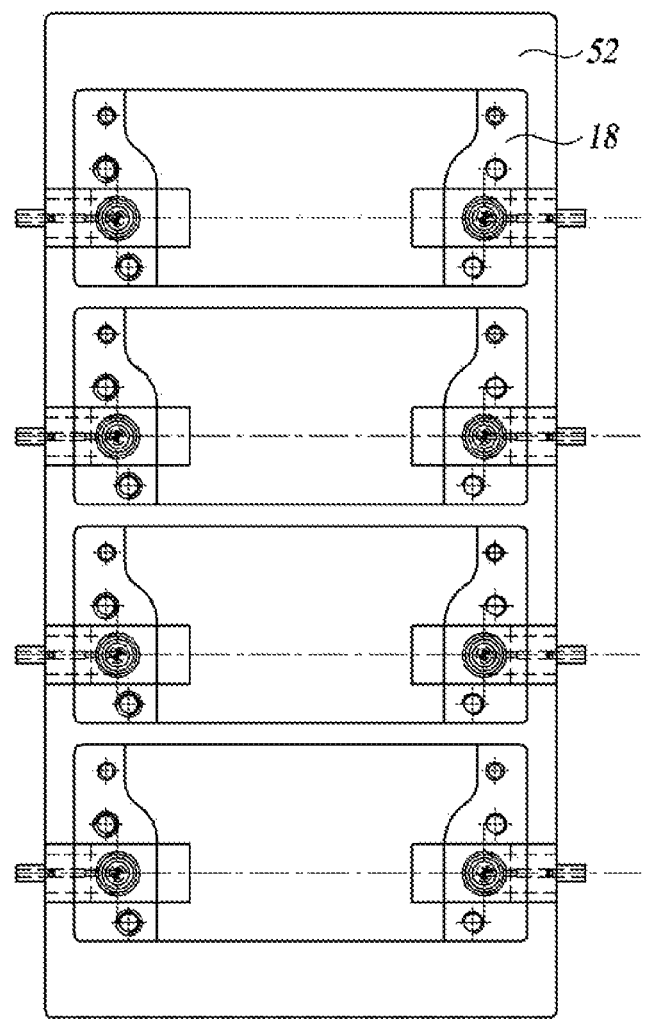
FIG. 23 is a plan view showing a test board of a cavity filter according to an embodiment of the present disclosure, from which a star washer arranged to surround the elastic connector is omitted.

FIG. 23 is a plan view showing a test board of a cavity filter according to an embodiment of the present disclosure, from which a star washer arranged to surround the elastic connector is omitted.

Figure 24:
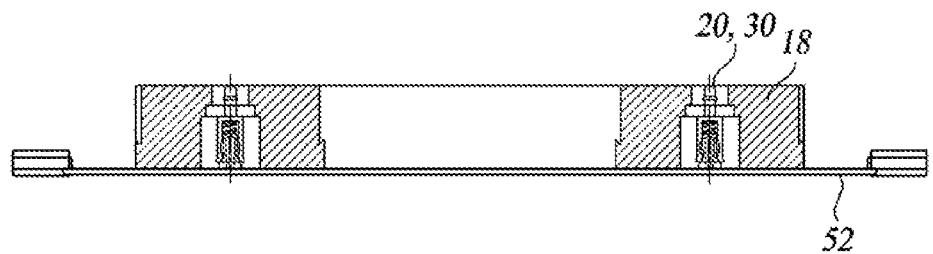
FIG. 24 is a sectional view showing the test board of the cavity filter of FIG. 23.

FIG. 24 is a sectional view showing the test board of the cavity filter of FIG. 23.

Referring to FIGS. 23 and 24, the second annular groove 270 surrounding the third insertion hole 216 and the star washer 260 accommodated therein are omitted. The illustrated configuration may further reduce the transverse length of the cavity filter 18. The terminal unit 20 may be modified to have various shapes as shown in FIG. 5.

FIG. 25 is a plan view showing a test board of a cavity filter employing a leaf spring-type elastic connector according to an embodiment of the present disclosure.

FIG. 26 is a cross-sectional view showing the test board of the cavity filter of FIG. 25 employing a leaf spring-type elastic connector.

Referring to FIGS. 25 and 26, the cavity filter 18 having a leaf spring-type terminal unit according to the embodiment allows the terminal unit 40 to have an outer diameter smaller than that in the embodiment shown in FIG. 22 or 24, and is advantageous in reducing the transverse length.

Basically, the test board 54 of the cavity filter 18 has a wide ground electrode surface formed on both sides. In addition, by arranging a plurality of plated through vias, which pass through the test board 54 and surround the circular pad to which the center terminal of the SMA RF connector 510 and the elastic connector 440 are connected, at proper intervals and pitches, variation in impedance may be minimized.

Hereinafter, an annular groove for accommodating a star washer and a configuration for preventing separation of the star washer will be described.

Figure 27:
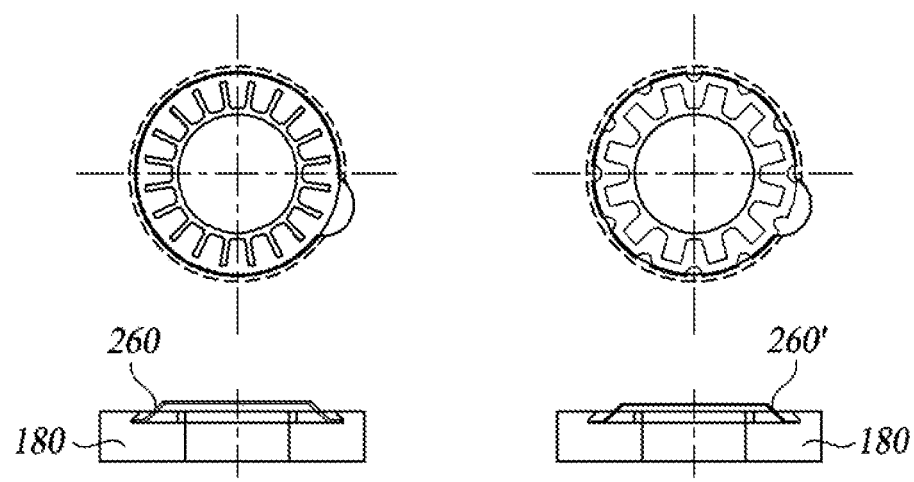
FIG. 27 is a conceptual view showing a star washer according to an embodiment of the present disclosure.

FIG. 27 is a conceptual view showing a star washer according to an embodiment of the present disclosure.

Figure 28:
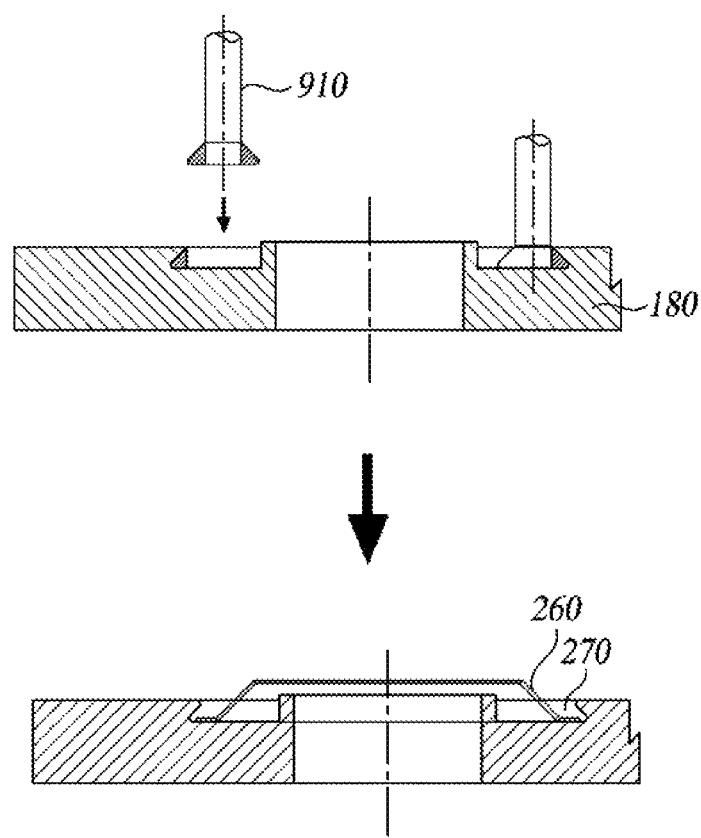
FIG. 28 is a conceptual view showing a process of forming a second annular groove of a dovetail shape for accommodating a star washer according to an embodiment of the present disclosure.

FIG. 28 is a conceptual view showing a process of forming a second annular groove of a dovetail shape for accommodating a star washer according to an embodiment of the present disclosure.

The first case 180 of the cavity filter 18 has a complex inner shape as it includes a resonance element (not shown), while having a hollow interior. The first case spaced is usually formed of a material containing aluminum or a magnesium alloy by press working.

Referring to FIG. 28, the second annular groove 270 of the first case 180 provided with a vertical wall is processed by a dovetail machining tool 910 so as to increase the diameter of the inner edge, thereby forming an accommodating portion for the star washer 260. The inlet of the second annular groove 270 having a dovetail shape has the minimum diameter that allows the star washer 260 to be contracted and inserted thereinto by elasticity.

Figure 29:
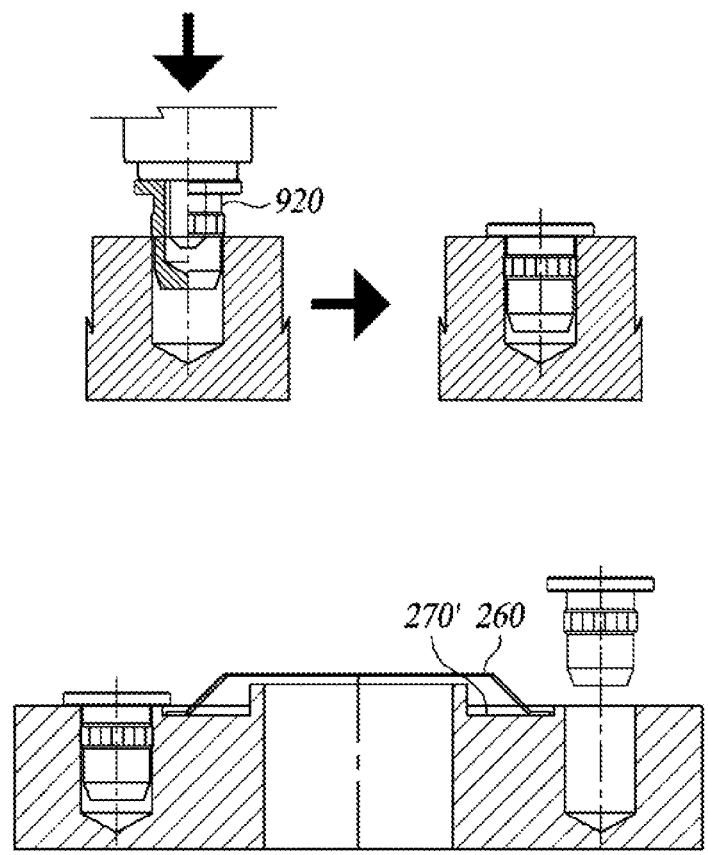
FIG. 29 is a conceptual view showing a second annular groove for accommodating a star washer and a press-fit pin for preventing separation of the star washer according to an embodiment of the present disclosure.

FIG. 29 is a conceptual view showing a second annular groove for accommodating a star washer and a press-fit pin for preventing separation of the star washer and according to an embodiment of the present disclosure.

Referring to FIG. 29, a plurality of holes into which a press-fit pin 920 is inserted is formed outside the second annular groove 270', and at least three press-fit pins 920 with thin heads are press-fitted into the holes to prevent the star washer 260 from being separated.

Figure 30:
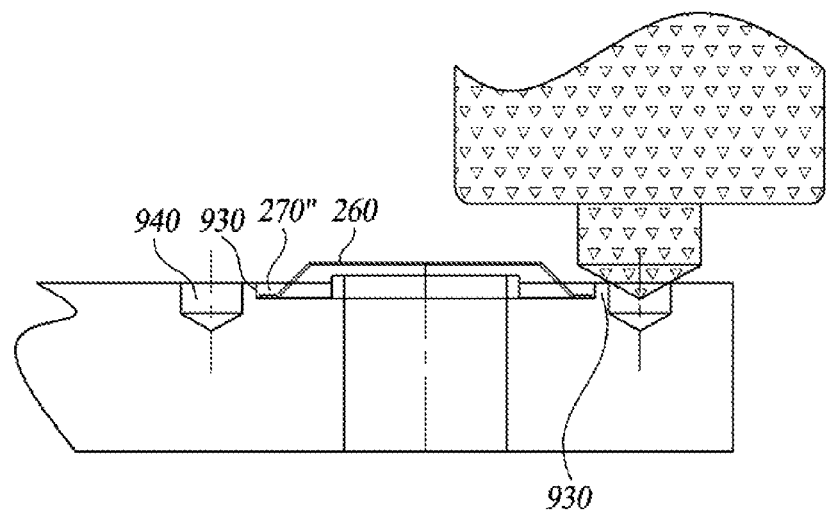
FIG. 30 is a conceptual view illustrating a second annular groove for accommodating a star washer and caulking for preventing separation of the star washer according to an embodiment of the present disclosure.

FIG. 30 is a conceptual view illustrating a second annular groove for accommodating a star washer and caulking for preventing separation of the star washer according to an embodiment of the present disclosure.

Referring to FIG. 30, a plurality of holes IS formed outside a second annular groove 270", and a sidewall 930 of the second annular groove 270" is recessed toward the star washers 260 by caulking to prevent the star washer 260 from being separated. The surface may locally rise due to caulking. Accordingly, the reference surface to which the PCB 130 is coupled may be formed at a higher position, or a shallow counter bore (not shown) may be formed at the upper end of the caulking hole 940 such that the height of the sidewall 930 of the second annular groove 270" is lower than the reference surface coupled to the PCB 130.

A conductive paste may be applied between the star washer 260 and the second annular groove 270" to ensure good electrical contact of the star washer 260 at all times.

The cavity filter 18 according to an embodiment of the present disclosure includes RF connection terminal units 20, 30, and 40 including elastic connectors 240, 340, and 440 formed such that terminals are exposed on both sides or one side in the height direction. Thereby, the thickness of the cavity filter 18 may be reduced, thereby implementing a massive MIMO antenna system with a slim and compact stack structure.

Although exemplary embodiments have been described for illustrative purposes, those skilled in the art will appreciate that and various modifications and changes are possible, without departing from the idea and scope of the embodiments. Exemplary embodiments have been described for the sake of brevity and clarity. Accordingly, one of ordinary skill would understand the scope of the embodiments is not limited by the explicitly described above embodiments but is inclusive of the claims and equivalents thereof.

CROSS-REFERENCE TO RELATED APPLICATION

This application claims priority under 35 U.S.C § 119(a) of Patent Application No. 10-2017-0013798, filed on Jan.

31, 2017 in Korea, and Patent Application No. 10-2017-0074330, filed on Jun. 13, 2018 in Korea, the entire content of which is incorporated herein by reference. In addition, this patent application claims priority in the countries other than the United States for the same reason as above, and the entire contents of which are incorporated herein by reference.

The invention claimed is:

1. A cavity filter used in a base station antenna for mobile communication and installed on an external member, comprising:
   a resonant element;
   a first case disposed on the external member and containing the resonance element therein; and
   a terminal unit arranged passing through the first case to electrically connect an electrode pad of the external member and the resonance element, the terminal unit being electrically insulated from the first case;
   wherein the terminal unit comprises:
      a terminal insertion hole formed in a lower end surface of the first case by recessing at least a part of the first case;
      a pin member comprising a pin portion disposed in the terminal insertion hole and having one end connected to the resonance element, and a terminal body portion extending from an opposite end of the pin portion and having a diameter larger than a diameter of the pin portion; and
      an elastic connector formed of a conductive material having elasticity and disposed between at least a portion of an inner wall surrounding the elastic connector of the terminal body portion and the electrode pad to electrically connect the terminal body portion and the electrode pad, the elastic connector being configured to be compressed to provide a contact pressure to the at least the portion of the inner wall surrounding the elastic connector of the terminal body portion and the electrode pad when the cavity filter is installed on the outer member.

2. The cavity filter of claim 1, further comprising:
   a dielectric bush inserted into the terminal insertion hole, wherein the terminal insertion hole comprises:
   a third insertion hole having a constant air gap with respect to the terminal body portion in a radial direction;
   a second insertion hole having a diameter smaller than a diameter of the third insertion hole, a part of the dielectric bush being inserted into the second insertion hole; and
   a first insertion hole having a diameter smaller than the diameter of the second insertion hole, and a part of the dielectric bush inserted into the first insertion hole.

3. The cavity filter of claim 2, wherein the terminal body portion is formed to be shorter than a depth of the third insertion hole and comprises:
   a cylindrical hollow portion; and
   a conical opening having a diameter decreasing inward from an inlet thereof.

4. The cavity filter of claim 3, wherein the hollow portion comprises a first annular groove formed in an inner circumferential surface of the hollow portion.

5. The cavity filter of claim 4, wherein the elastic connector comprises:
   a cylindrical member inserted into the hollow portion;
   a wedge-shaped annular protrusion protruding from an outer circumferential surface of the cylindrical member;
   a truncated cone-shaped pin socket contact portion extending from the cylindrical member and inserted into the opening;
   an impedance matching portion extending from the pin socket contact portion; and
   at least one cutout portion formed along a central axis of the elastic connector from an outer side surface of the elastic connector exposed to an outside after being inserted into the hollow portion,
   wherein the cutout extends to a depth passing the annular protrusion,
   wherein the annular protrusion is formed to have a size preventing the elastic connector from being separated by being accommodated in the first annular groove when the elastic connector is inserted into the hollow portion.

6. The cavity filter of claim 5, wherein an angle of the pin socket contact portion with respect to the central axis is larger by 5 to 10 degrees than an angle of the opening with respect to the center axis.

7. The cavity filter of claim 5, wherein an electrode edge formed by an outer side surface of the elastic connector and an outer circumferential surface of the impedance matching portion has a round shape in a range of R0.1 to R0.5.

8. The cavity filter of claim 4, further comprising a compression spring-type pin spring inserted into a space between an inner side surface of the hollow portion and the elastic connector.

9. The cavity filter of claim 3, wherein the elastic connector comprises:
   a circular spring portion formed of an elongated spring plate having a constant width over most of a length thereof except for both ends thereof and having a circular central portion; and
   two plate-shaped protrusions protruding from two adjacent points on a circumference of the circular spring portion so as to be perpendicular to the circumference,
   wherein the width of the spring plate member is less than a diameter of the hollow portion,
   wherein a diameter of the circular spring portion is larger than a diameter of the terminal body portion.

10. The cavity filter of claim 9, wherein the opening is formed at an angle allowing the circular spring portion to circumscribe about the opening.

11. The cavity filter of claim 9, wherein a gap between the hollow portion and the plate-shaped protrusion inserted into the hollow portion is filled with solder to electrically and mechanically connect the elastic connector and the pin member.

12. The cavity filter of claim 2, further comprising a star washer electrically connected to the first case,
    wherein the first case further comprises a second annular groove surrounding the third insertion hole,
    wherein the second annular groove is formed to accommodate the star washer such that at least a part of the star washer protrudes out of the lower end surface of the first case.

13. The cavity filter of claim 12, wherein the second annular groove is formed in a circular dovetail shame such that a diameter of a circumferential surface thereof corresponding to an outer diameter increases in a depth direction,
    wherein an inlet outer diameter of the second annular groove is a minimum diameter allowing the star washer to be contracted and inserted into the second annular groove by elasticity and preventing the star washer from being separated.

14. The cavity filter of claim 12, wherein the second annular groove comprises:
- a plurality of press-fit pin holes formed around the second annular groove; and
- a press-fit pin inserted into the press-fit pin holes having a head portion positioned lower than the lower end surface of the first case when the press-fit pin is into the press-fit pin holes, the head portion at least partially protruding to the second annular groove to prevent the star washers from being separated.

15. The cavity filter of claim 12, wherein the second annular groove comprises a calking hole formed around the second annular groove so as to be close to the second annular groove,
- wherein, after the star washer is inserted, a sidewall of the circumferential surface corresponding to the outer diameter of the second annular groove is recessed toward a central axis of the second annular groove by caulking to prevent the star washer from being separated.

16. The cavity filter of claim 1, further comprising:
- a dielectric bush inserted into the terminal insertion hole,
- wherein the dielectric bush is formed in a two-stage cylindrical shape having a first stage and a second stage having a larger diameter than the first stage, and is provided with a through hole passing through a central axis of rotation,
- wherein the pin portion is inserted into the through hole from a side to the second stage to fix the pin member to the dielectric bush.

17. The cavity filter of claim 16, wherein the terminal insertion hole comprises:
- a fourth insertion hole formed from the lower end surface of the first case and having a diameter equal to a diameter of a large-diameter part of a two-stage cylindrical shape of the dielectric bush, the fourth insertion hole extending a long distance so as to be parallel to the lower end surface; and
- a fifth insertion hole formed at a central position of one side of the fourth insertion hole, a first stage of the dielectric bush being inserted into the fifth insertion hole.

18. The cavity filter of claim 17, wherein the elastic connector comprises:
- a pin insertion hole allowing the elastic connector to be inserted thereinto and supported by the terminal body portion;
- a first extension extending in a direction perpendicular to a center axis of the pin portion; and
- a second extension portion bent from the first extension portion at an obtuse angle and extended to protrude out of the lower end surface of the first case.

19. The cavity filter of claim 18, wherein the terminal body portion is formed such that an outer side surface of the terminal body portion has a predetermined air gap from the lower end surface of the first case when the elastic connector is inserted into the pin portion through the pin insertion hole and the pin member is connected to the dielectric bush.

20. The cavity filter of claim 1, further comprising:
- a dielectric bush inserted into the terminal insertion hole,
- wherein the pin portion comprises a wedge-shaped protrusion formed on an outer circumferential surface thereof to prevent the pin portion from being separated in a direction opposite to a direction of insertion into the dielectric bush.

* * * * *